(12) United States Patent
Ohshima et al.

(10) Patent No.: US 6,251,754 B1
(45) Date of Patent: Jun. 26, 2001

(54) SEMICONDUCTOR SUBSTRATE MANUFACTURING METHOD

(75) Inventors: Hisayoshi Ohshima, Obu; Masaki Matsui; Kunihiro Onoda, both of Nagoya; Shoichi Yamauchi, Obu, all of (JP)

(73) Assignee: Denso Corporation, Aichi-Pref (JP)

( * ) Notice: Subject to any disclaimer, the term of this patent is extended or adjusted under 35 U.S.C. 154(b) by 0 days.

(21) Appl. No.: 09/074,384

(22) Filed: May 8, 1998

(30) Foreign Application Priority Data

| May 9, 1997 | (JP) | 9-119228 |
| May 30, 1997 | (JP) | 9-141671 |
| May 15, 1997 | (JP) | 9-125506 |
| Aug. 27, 1997 | (JP) | 9-231189 |

(51) Int. Cl.$^7$ .................................................. H01L 21/20
(52) U.S. Cl. .................. 438/506; 438/506; 438/406; 438/458
(58) Field of Search ...................... 438/506, 11, 24, 438/406, 458

(56) References Cited

U.S. PATENT DOCUMENTS

| 4,144,099 | * | 3/1979 | Edmonds et al. ...................... 148/1.5 |
| 4,509,990 | * | 4/1985 | Vasudev ................................. 148/1.5 |
| 4,837,172 | * | 6/1989 | Mizuno et al. ........................ 437/11 |
| 5,374,564 | * | 12/1994 | Bruel ...................................... 437/24 |

(List continued on next page.)

FOREIGN PATENT DOCUMENTS

| 767486 | 4/1997 | (EP) . |
| 1-302837 | 12/1984 | (JP) . |
| 5-211128 | 8/1993 | (JP) . |
| 7-94741 | 4/1995 | (JP) . |
| 7-302889 | 11/1995 | (JP) . |
| 9-181011 | 7/1997 | (JP) . |
| 9-213594 | 8/1997 | (JP) . |

OTHER PUBLICATIONS

M. Bruel et al. "Smart–Cut: A new silicon on insulator material tech . . . " Japan. Journ. of Appl. Phys. vol. 36 p. 1636–1641 Mar. 1997.*

Nakajima et al, "Behavior of blister formation in helium and hydrogen 2 step implanted silicon wafers", Applied Physics Academy Symposium Preliminary Reports, Oct. 1997, 3p–PB–2, pp. 818.

Takada et al, "In–situ observation of "Smart–Cut®" by Thermal Desorption Spectroscopy (2) –dose dependence of splitting temperature–", Applied Physics Academy Symposium Preliminary Reports, Oct. 1997, 3p–PB–3, pp. 819.

(List continued on next page.)

*Primary Examiner*—Matthew Smith
*Assistant Examiner*—Granvill Lee
(74) *Attorney, Agent, or Firm*—Pillsbury Winthrop LLP

(57) ABSTRACT

The invention provides a number of semiconductor substrate manufacturing methods with which, in manufacturing a semiconductor substrate having a semiconductor layer in an insulated state on a supporting substrate, it is possible to obtain a thick semiconductor layer with a simple process and cheaply while reducing impurity contamination of the semiconductor layer to a minimum. One of these methods includes a defective layer forming step of carrying out ion implantation to a predetermined depth from the surface of a base substrate to partition off a monocrystalline thin film layer at the surface of the base substrate by a defective layer formed by implanted ions, a semiconductor film forming step of forming a monocrystalline semiconductor film of a predetermined thickness on the monocrystalline thin film layer, a laminating step of laminating the base substrate by the surface of the monocrystalline semiconductor film to the supporting substrate, and a detaching step of detaching the base substrate laminated to the supporting substrate at the defective layer.

55 Claims, 15 Drawing Sheets

U.S. PATENT DOCUMENTS

| | | | |
|---|---|---|---|
| 5,376,560 | * 12/1994 | Aronowitz et al. | 437/24 |
| 5,494,835 | 2/1996 | Bruel . | |
| 5,559,043 | 9/1996 | Bruel . | |
| 5,854,123 | * 12/1998 | Sato et al. | 438/507 |
| 5,882,987 | * 3/1999 | Srikrishnan | 438/458 |
| 5,953,622 | * 9/1999 | Lee et al. | 438/458 |
| 6,054,363 | * 4/2000 | Sakaguchi | 438/406 |
| 6,146,979 | * 11/2000 | Henley et al. | 438/458 |

OTHER PUBLICATIONS

Takada et al, "In–situ observation of "Smart–Cut" by Thermal Desorption Spectroscopy [Expreimental Method]", Applied Physics Academy Symposium Preliminary Reports, Mar. 1997, 29p–G–11, pp. 739, Oct. 1996, pp. 150–151.

Hara et al, "H+ Implantation in Si for the Void Cut SOI Manufacturing", IEEE, 1997, pp. 45–48.

Lee et al, "A Novel Pattern Transfer Process for Bonded SOI Giga–bit DRAMs", IEEE International SOI Conference, Oct. 1996, pp. 114–115.

Bruel et al, "Smart–Cut: A New Silicon On Insulator Material Technology Based on Hydrogen Implantation and Wafer Bonding", Japanese Journal of Applied Physics, vol. 36, Mar. 1997, pp. 1636–1647.

Liu et al, "Effect of Total Dose Radiation on FETs Fabricated in UNIBOND™ SOI Material", Proceedings 1996 IEEE International SOI Conference, Oct. 1996, pp. 94–95.

Kuehne et al, "Deep Sub–Micron SOI MOSFET With Buried Body Strap", Proceedings 1996 IEEE International SOI Conference, Oct. 1996, pp. 96–97.

Yang et al, "Silicon–on–Insulator–with–Active–Subrstrate (SOIAS) Technology", Proceedings 1996 IEEE International SOI Conference, Oct. 1996, pp. 106–107.

Weldon et al, "Mechanistic Studies of Hydrophilic Wafer Bonding and Si Exfoliation for SOI Fabrication", Proceedings 1996 IEEE International SOI Conference, Oct. 1996, pp. 150–151.

Moriceau et al, "Cleaning and Polishing As Key Steps For Smart–Cut® SOI Process", Proceedings 1996 IEEE International SOI Conference, Oct. 1996, pp. 152–153.

Conley Jr. et al, "Electron Spin Resonance Characterization of Unibond® Material", Proceedings 1996 IEEE International SOI Conference, Oct. 1996, pp. 164–165.

Aspar et al, "Transfer of structured and patterned thin silicon films using the Smart–Cut® process", Electronics Letters, vol. 32, No. 21, Oct. 10, 1996, pp. 1985–1986.

Hara et al, "Ion Implantation and Annealing Conditions for Delamination of Silicon Layers by Hydrogen Ion Implantation", Journal of the Electrochemical Society, vol. 144, No. 4, Apr. 1997, pp. L78–L81.

Tong et al, "Layer splitting process in hydrogen–implanted Si, Ge, SIC, and diamond substrates", Applied Physics Letters, vol. 70, No. 11, Mar. 17, 1997, pp. 1390–1392.

Auberton–Herve and Hyodo, "Unibord SOI wafer due to Smart Cut", Electronic Material, Jun. 1997, pp. 29–33.

Bruel et al, "®"Smart Cut": A Promising New SOI Material Technology", Proceedings 1995 IEEE International SOI Conference, Oct. 1995, pp. 178–179.

M. Bruel, "Silicon on insulator material technology", Electronics Letters, vol, 31, No. 14, Jul 6, 1995, pp. 1201–1202.

Aspar et al, "Basic mechanisms involved in the Smart–Cut® process", Microelectronic Engineering 36, (1997), pp. 233–240.

Bruel et al, "Unibond® SOI Wafers Achieved by Smart–Cut® Process", (name of article, date, page number: not available).

Ohmi, Tadahiro, "Future of Semiconductor Technology", J. IEE Japan, vol. 117, No. 2, pp. 88–93.

Maleville et al, "Wafer bonding and H–implantation mechanisms involved in the Smart–cut® technology", Materials Science & Engineering B46, 1997, pp. 14–19.

Hara et al, "Delaminations of Thin Layers by High Dose Hydrogen Ion Implantation in Silicon", Journal of The Electrochemical Society, vol. 143, No. 8, Aug. 1996, pp. L166–L168.

M Bruel, "Silicon on insulator material technology", IEE, 1995, May 24, 1995.

Auberton–Herve et al, "A New SOI Material : Smart–Cut®", (name of article, date, page number: not available).

Aspar et al, "Smart–Cut® : The basic fabrication process for UNIBOND® SOI wafers", (name of article, date, page number: not available).

Bruel et al, "Smart–Cut: A New S.O.I. Material Technology Based Hydrogen Implantation and Wafer Bonding", Extended Abstracts of the 1996 International Conference on Solid State Devices and Materials, Yokohama, 1996, pp. 458–460.

Auberton–Herve et al, "SOI Materials for ULSI Applications", (name of article, date, page number: not available).

* cited by examiner

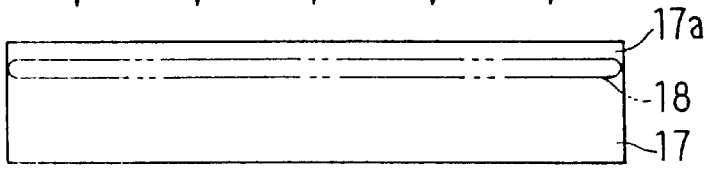
FIG. 5A
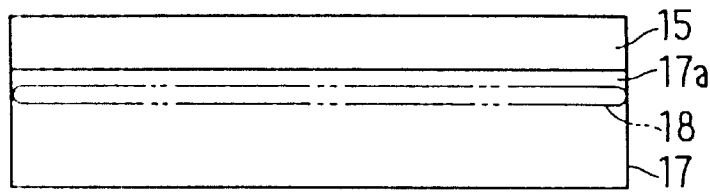
FIG. 5B
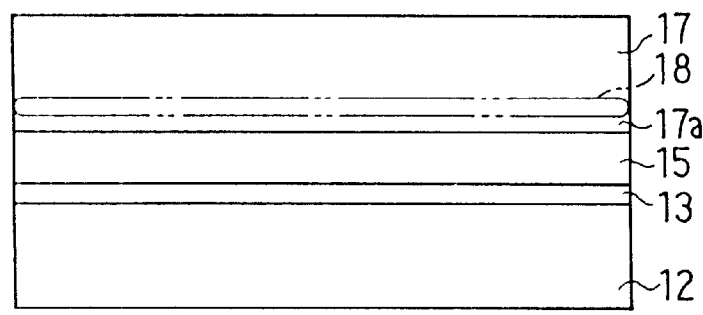
FIG. 5C
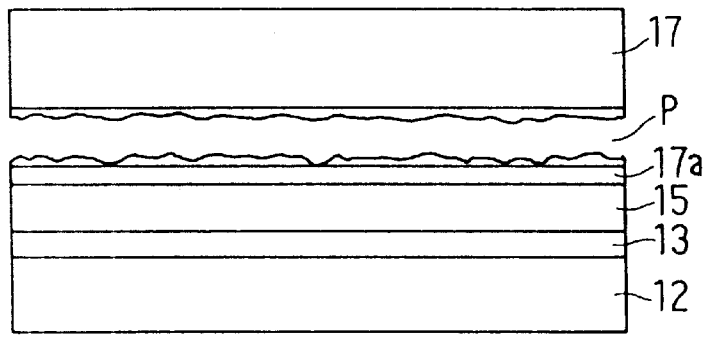
FIG. 5D
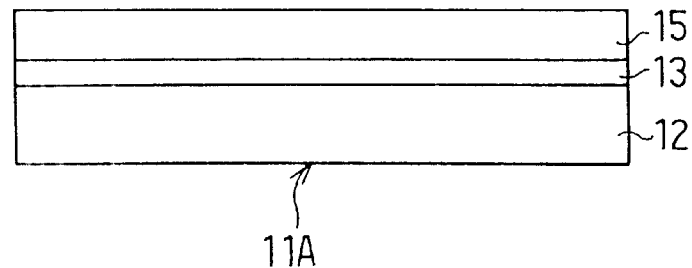
FIG. 5E

FIG. 11A
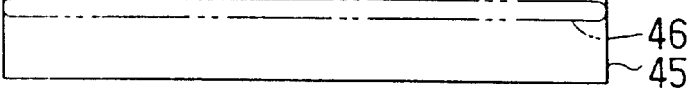
FIG. 11B
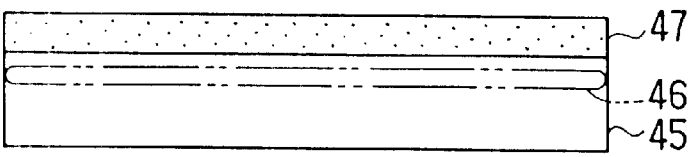
FIG. 11C
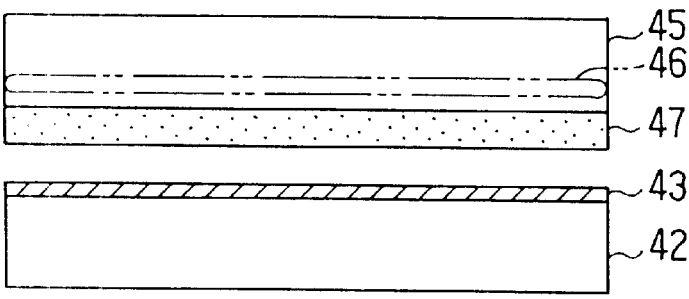
FIG. 11D
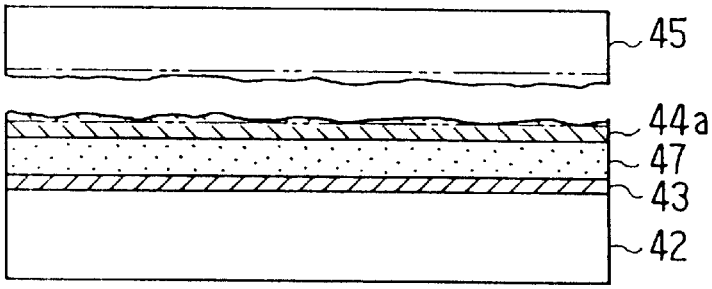
FIG. 11E
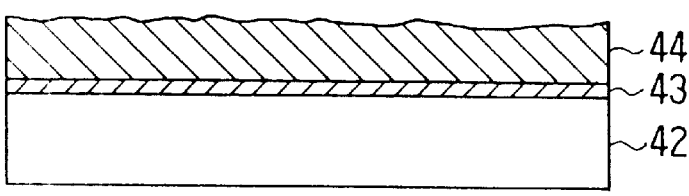
FIG. 11F
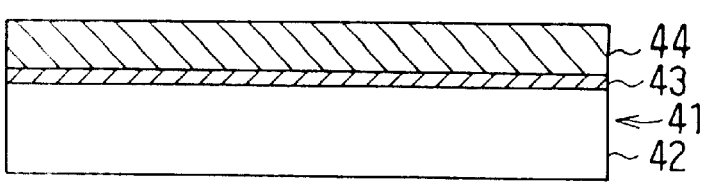

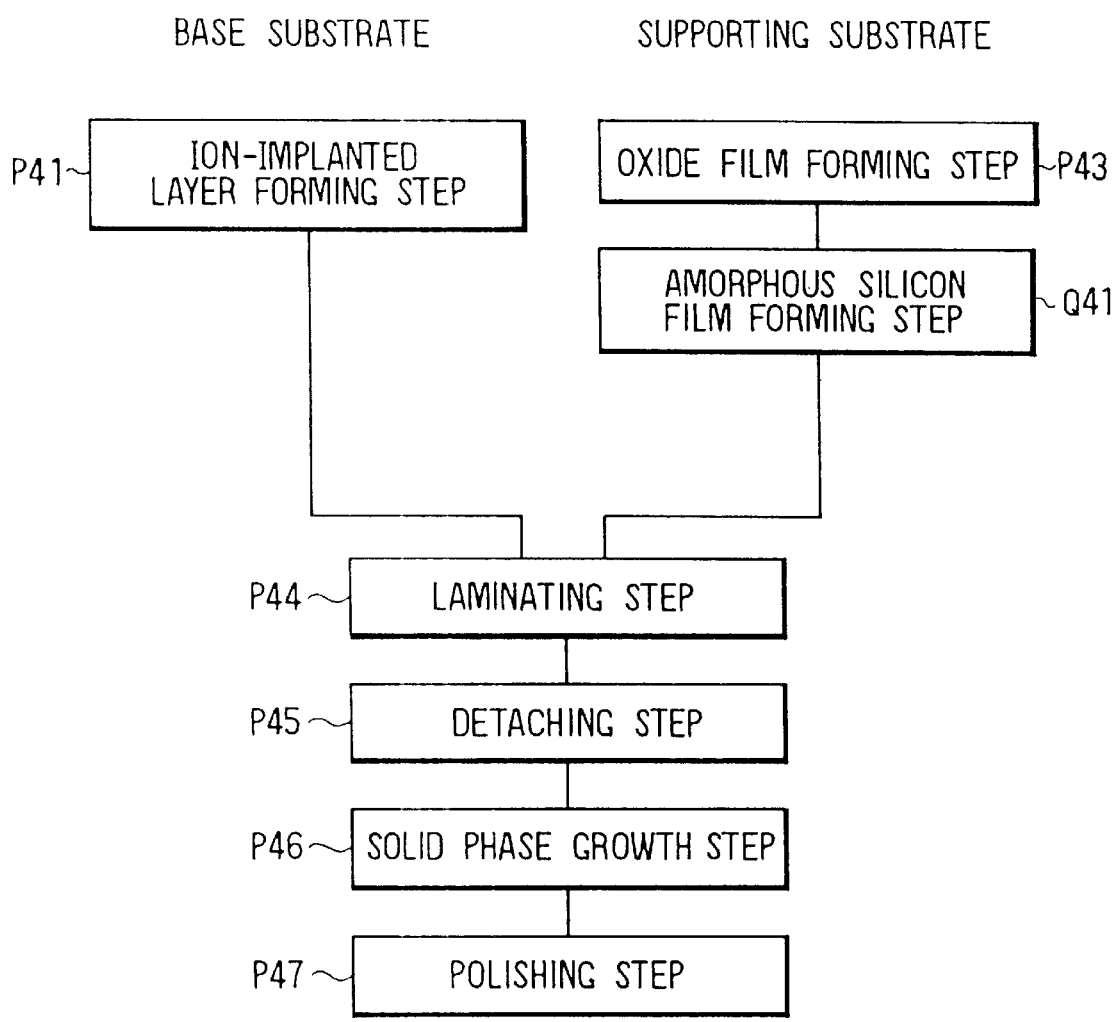

US 6,251,754 B1

SEMICONDUCTOR SUBSTRATE MANUFACTURING METHOD

CROSS REFERENCE TO RELATED APPLICATION

This application is based upon and claims the benefit of priority of Japanese Patent Appliocations No. H.9-119228 filed on May 9, 1997, No. H.9-125506 filed on May 15, 1997, No. H.9-141671 filed on May 30, 1997, and No. H.9-231189 filed on Aug. 27, 1997, the contents of which are incorporated by reference.

BACKGROUND OF THE INVENTION

1. Field of the Invention

This invention relates to a method for manufacturing a semiconductor substrate comprising a semiconductor layer for device formation provided on a supporting substrate and insulated from the supporting substrate.

2. Related Art

As one type of semiconductor substrates, there is a SOI (Silicon On Insulator) substrate made by providing a monocrystalline silicon layer on a silicon substrate and interposing an insulating film therebetween. As a method for manufacturing a SOI substrate of this kind, so-called smart cut methods using lamination, of the kind shown in for example Japanese Patent Application Laid-Open No. H.5-211128, have been proposed.

In this method, as shown in FIGS. 16A through 16D, a SOI substrate is manufactured in three stages (steps). In the first stage, as shown in FIG. 16A, ions obtained by ionizing, for example, hydrogen gas are accelerated with a predetermined implantation energy and implanted into a base substrate 1 made of monocrystalline silicon. In this way, a defective layer 2 is formed at a predetermined depth in the base substrate 1. Here, a layer of the base substrate 1 above the defective layer 2 constitutes a thin film layer 1a eventually to become a monocrystalline silicon layer for device formation.

In the second stage, as shown in FIG. 16B, a supporting substrate 3 made of, for example, silicon is laminated to the upper face of the base substrate 1. At this time, an insulating film 4 consisting of an oxide film has been formed on the surface (in FIG. 16B, the lower surface) of the supporting substrate 3 in advance. Then, in the third stage, as shown in FIG. 16C, by heat treatment, the thin film layer 1a is detached from the base substrate 1 along the defective layer 2.

In this way, the thin film layer 1a is laminated to the insulating film 4 on the supporting substrate 3. After that, as shown in FIG. 16D, by polishing of the detachment face being carried out, a SOI substrate 6 having a monosilicon layer 5 is obtained. With this method, it is possible to obtain a monosilicon layer 5 of high quality. Also, the base substrate 1, while being reduced in thickness, can be reused.

When this kind of SOI substrate 6 is to be used, for example, for a power device or a surface micromachine, the monosilicon layer 5 is required to have a high thickness (for example several micrometers to several tens of micrometers). However, with the related art manufacturing method described above, to make the monosilicon layer 5 sufficiently thick it is necessary to make the ion implantation deep (make the position at which the defective layer 2 is formed deep).

Consequently, the ion implantation energy is high and a large amount of ion beam current is required. Also, an expensive ion implantation apparatus is also needed. In this case, to form a monosilicon layer 5 of thickness for example 10 μm, an ion implantation energy of over 1 MeV is necessary. Also, there has been the problem that there is increased contamination by impurities such as heavy metals and damage in the thin film layer 1a and hence the monosilicon layer 5 due to heavy metal knock-on to the inside of the thin film layer 1a (the monosilicon layer 5) occurring incidentally along with the use of greater acceleration energies. Furthermore, it is not possible to reuse the base substrate 1 many times.

SUMMARY OF THE INVENTION

It is therefore an object of the present invention to provide a semiconductor substrate manufacturing method with which, in manufacturing a semiconductor substrate having a semiconductor layer on a supporting substrate, it is possible to obtain a thick semiconductor layer with a simple process and cheaply.

It is an another object of the present invention to provide a semiconductor substrate manufacturing method with which it is possible to suppress impurity contamination of the semiconductor layer to the utmost.

To achieve these objects and other objects, a first semiconductor substrate manufacturing method provided by the invention includes a defective layer forming step of carrying out ion implantation to a predetermined depth from the surface of a base substrate made of a monocrystalline semiconductor to form a defective layer for detachment use and partitioning off a monocrystalline thin film layer at the surface of the base substrate, a semiconductor film forming step of forming a monocrystalline semiconductor film of a predetermined thickness on the monocrystalline thin film layer at the surface of the base substrate, a laminating step of laminating the base substrate at the surface of the monocrystalline semiconductor film to a supporting substrate, and a detaching step of detaching the base substrate laminated to the supporting substrate at the defective layer.

Because the thickness of the semiconductor layer can be adjusted by adjusting the thickness to which the monocrystalline semiconductor film is formed in the semiconductor film forming step, even when the monocrystalline thin film layer formed at the surface of the base substrate in the defective layer forming step is made extremely thin, the semiconductor layer can be made thick. Therefore, the energy of the ion implantation in the defective layer forming step can be made low, and contamination of the monocrystalline thin film layer by heavy metals and the like can be suppressed.

As a result, there are the highly valuable practical effects that, even when a thick semiconductor layer is to be formed on the supporting substrate, the SOI substrate can be manufactured with a simple process and cheaply and furthermore impurity contamination can be kept low.

A second manufacturing method provided by the invention includes a defective layer forming step of carrying out ion implantation to a predetermined depth from the surface of a base substrate made of a monocrystalline semiconductor to form a defective layer for detachment use so as to provide a monocrystalline thin film layer at the surface of the base substrate, a laminating step of laminating the base substrate at the surface of the monocrystalline thin film layer to a supporting substrate, a detaching step of detaching the base substrate laminated to the supporting substrate at the defective layer, and a semiconductor film forming step of forming a monocrystalline semiconductor layer of a predetermined thickness on the monocrystalline thin film layer on the surface of the supporting substrate.

In the second semiconductor substrate manufacturing method also, because the thickness of the semiconductor layer can be adjusted by adjusting the thickness to which the monocrystalline semiconductor film is formed in the semiconductor film forming step, even when the monocrystalline thin film layer formed at the surface of the base substrate in the defective layer forming step is made extremely thin, the semiconductor layer can be made thick. Therefore, the energy of the ion implantation in the defective layer forming step can be made low, and contamination of the monocrystalline thin film layer by heavy metals and the like can be suppressed.

As a result, there are the highly valuable practical effects that, even when a thick semiconductor layer is to be formed on the supporting substrate, the SOI substrate can be manufactured with a simple process and cheaply and furthermore impurity contamination can be kept low.

In the manufacturing methods described above, the ion implantation in the defective layer forming step may be carried out with an oxide film formed on the surface of the base substrate and the oxide film then removed after the formation of the defective layer. In this way, it is possible to prevent to the utmost contamination of the monocrystalline thin film layer by impurities such as heavy metals at the time of the ion implantation.

In the first semiconductor substrate manufacturing method described above, the defective layer formed in the base substrate must be maintained unchanged from the defective layer forming step to the detaching step. That is, when a high temperature acts on the base substrate in the semiconductor film forming step, there is a danger of implanted ions desorbing from the base substrate and the defective layer for detachment use consequently losing its function. For this reason, the semiconductor film forming step in the first semiconductor substrate manufacturing method is preferably carried out at a low temperature such that there is little desorption of implanted ions from the base substrate. In this way, it is possible to prevent the occurence of ions desorbing from the base substrate.

In the defective layer forming step in the manufacturing methods described above, along with the ion implantation, there is a certain amount of impurity contamination of the monocrystalline thin film layer. In this case, in the semiconductor film forming step, when a high temperature acts on the base substrate, there is a danger of impurities contained in the monocrystalline thin film layer diffusing into and contaminating the monocrystalline semiconductor film formed. For this reason, the semiconductor film forming step is preferably carried out at a temperature such that diffusion of impurities from the monocrystalline thin film layer into the monocrystalline semiconductor film is suppressed. In this way, it is possible to effectively prevent the diffusion of contaminants into the monocrystalline semiconductor film.

Also, in the semiconductor film forming step, as a method for depositing the monocrystalline semiconductor film on the monocrystalline thin film layer, epitaxial growth such that crystals are grown in alignment with the crystal axis of the monocrystalline thin film layer can be used. Pratice of epitaxial growth makes it is possible to form a monocrystalline semiconductor film of high quality. Also, as the apparatus for effecting this epitaxial growth, a molecular beam epitaxy apparatus can be used to carry out the step of forming the monocrystalline semiconductor film at a relatively low temperature. Instead of this, the monocrystalline semiconductor film may be epitaxially grown in the gas phase using a CVD reactor. In this case, also it is possible to keep the film-forming temperature lower than the desorption temperature of the implanted ions.

In the first semiconductor substrate manufacturing method described above, after the detaching step, a detachment face polishing step may be carried out to remove a part of a monocrystalline thin film layer damaged by the ion implantation, thus improving the quality of the semiconductor layer. Also, in the detaching face polishing step, the monocrystalline thin film layer may be polished so that the monocrystalline semiconductor film becomes exposed.

As the supporting substrate, a substrate made by forming an oxide film on a silicon substrate can be used. When silicon is then used for the semiconductor layer, the thermal expansion coefficients are the same and the thermal characteristics are good, and furthermore handling in device formation can made be the same as in the case of an ordinary silicon wafer. Also, the supporting substrate need only have rigidity, for supporting the semiconductor layer by way of the oxide film, and an expensive substrate having high crystallinity does not have to be used.

The base substrate from which the monocrystalline thin film layer has been detached can be used as a new base substrate with its detachment face finished by polishing. Although the thickness of the base substrate decreases by an amount corresponding to the extremely thin layer detached each time, the base substrate can be used repeatedly many times as long as the base substrate has sufficient strength for detaching the monocrystalline thin film layer therefrom, and it is thereby possible to reduce the overall costs.

A third semiconductor substrate manufacturing method provided by the invention comprises a hydrogen rich layer forming step of forming a hydrogen rich layer on a monocrystalline semiconductor substrate, a growth layer forming step of forming a noncrystalline growth layer on the monocrystalline semiconductor substrate with the hydrogen rich layer interposed therebetween, and a laminating step of laminating the monocrystalline semiconductor substrate at the surface of the growth layer to a supporting substrate. After that, in a solid phase growth step, heat treatment is carried out at a first treatment temperature, whereby solid phase growth from the monocrystalline semiconductor substrate toward the hydrogen rich layer side is started and hydrogen inside the hydrogen rich layer is moved to the surface and accumulated there.

Heat treatment is then carried out at a second treatment temperature in a detaching step, whereupon the leading edge of the solid phase growth reaches and progressively monocrystallizes the growth layer, whereby a semiconductor layer is formed. Also, detachment occurs at a defective layer part formed by hydrogen moving to the surface side of the hydrogen rich layer. As a result, the semiconductor layer is left on the supporting substrate and separated from the monocrystalline semiconductor substrate. In this way, it is possible to obtain a semiconductor substrate.

By forming the noncrystalline growth layer as thick as necessary, it is possible to obtain a thick semiconductor layer by monocrystallizing the noncystalline growth layer in the solid phase growth forming step. Thus, it is possible to make unnecessary a process for forming a defective layer in a deep region by accelerating ions into a substrate with a high acceleration energy to form the semiconductor layer. As a result, it becomes unnecessary to use an expensive ion implantation apparatus to perform an ion implantation at a high power and also it is possible to form a semiconductor substrate simply and cheaply.

The monocrystalline semiconductor substrate used to monocrystallize the noncrystalline growth layer must have good crystallinity because it affects the film quality of the semiconductor layer and will be a high-cost one. However, because as described above its thickness in theory does not decrease, it can be used repeatedly as a monocrystalline semiconductor substrate for manufacturing a semiconductor substrate and cost reductions can thereby be achieved.

Before the growth layer forming step, a segregation layer forming step is preferably carried out to form a segregation layer on the hydrogen rich layer of the monocrystalline semiconductor substrate. When this is done, in the heat treatment of the solid phase growth step, the segregation layer acts as a stopper with respect to hydrogen desorbing from the inside of the hydrogen rich layer and advancing to the surface side of the growth layer when solid phase growth starts from the monocrystalline semiconductor substrate. As a result, the hydrogen accumulates in an extremely thin film along the segregation layer.

Then, in the heat treatment of the detaching step, detachment occurs at the extremely thin film along the segregation layer where hydrogen has accumulated. That is, by forming a segregation layer in this way, it is possible to positively provide the defective layer in a narrow region and thereby reduce the roughness of the surface after detachment.

After the detaching step is carried out, heat treatment may be performed at a third treatment temperature in a crystal completion treatment step. Accordingly, it is possible to enhance the crystallinity of the semiconductor layer and raise the strength of the bond between the semiconductor layer and the supporting substrate.

According to a fourth semiconductor substrate manufacturing method provided by the invention, in an ion-implanted layer forming step an ion-implanted layer is formed by ion implantation at a predetermined depth from the surface of a base substrate for forming a thin film semiconductor layer, and in a noncrystalline film forming step a semiconductor noncrystalline film is formed on the face of the base substrate from which the ion-implanted layer was formed. After that, in a laminating step the base substrate is laminated to a supporting substrate with the semiconductor noncrystalline film therebetween. Then, in a detaching step, heat treatment is carried out to detach the base substrate at the ion-implanted layer so that the noncrystalline film and a thin film semiconductor layer thereon are left on the supporting substrate.

The semiconductor substrate thus formed is then heat treated to recrystallize the noncrystalline film into a semiconductor layer with the thin film semiconductor layer serving as a nucleus. The semiconductor layer has a total film thickness of the thin film semiconductor layer with the noncrystalline film added.

Therefore, without performing the ion implantation in the ion-implanted layer forming step at a high energy, by going through an ion implantation step using an ordinary ion implantation apparatus, it is possible to form a semiconductor layer of a desired film thickness. Also, heavy metal contamination and oxygen inclusion to the semiconductor layer arising incidentally at the time of the ion implantation can be maximally reduced. Furthermore, defective regions such as pits and voids at the substrate surface can be eliminated by the recrystallization of the noncrystalline film.

In the ion-implanted layer forming step an ion-implanted layer may be formed by ion implantation at a predetermined depth from the surface of a base substrate, and in the noncrystalline film forming step a semiconductor noncrystalline film may be formed in an insulated state on the supporting substrate side. After that, in the laminating step the base substrate and the supporting substrate are laminated to each other. By heat treatment carried out in the detaching step, the base substrate is detached at the ion-implanted layer so that a noncrystalline film and a semiconductor layer are formed on the supporting substrate. Thus, it is possible to obtain the same effects as described above.

By heat treating a noncrystalline film formed on a supporting substrate in the detaching step or in a step subsequent thereto, the noncrystalline film can be recrystallized with the semiconductor layer formed thereon as a nucleus. In this way, it is possible to form a semiconductor layer of a desired film thickness by going through a simple process irrespective of the level of the ion implantation energy of the ion implantation apparatus. Also, by employing this kind of manufacturing method, it is possible to reduce the thickness of the semiconductor layer damaged by ion implantation and form a semiconductor layer with as little damage as possible, and pit and void parts can be eliminated in the recrystallization by solid phase growth of the semiconductor layer.

In a further method provided by the invention, in an ion-implanted layer forming step an ion-implanted layer is formed by ion implantation at a predetermined depth from the surface of a base substrate. In a laminating step the ion-implanted layer side of the base substrate is laminated to a supporting substrate. In a detaching step heat treatment is carried out on the base substrate and the supporting substrate, and the base substrate is thereby detached at a defective layer formed by the ion-implanted layer to form a thin film semiconductor layer on the supporting substrate. In a noncrystalline film forming step a semiconductor noncrystalline film is formed on the thin film semiconductor layer formed on the supporting substrate. Then, in a solid phase growth step the semiconductor noncrystalline film is crystallized with the thin film semiconductor layer as a nucleus to form a semiconductor layer of a required film thickness. By this embodiment it is possible to obtain the same effects as those discussed above.

In the noncrystalline film forming step, the semiconductor noncrystalline film can be formed by plasma CVD. By using plasma CVD, it is possible to form a semiconductor noncrystalline film and obtain a semiconductor substrate of the construction described above without employing a special step.

A polishing step may be provided and the surface of the detached semiconductor layer polished in this polishing step. By polishing, it is possible to smooth out small irregularities present in the detachment face and obtain a semiconductor substrate having a surface ready for device formation.

In the semiconductor substrate manufacturing method described above, the ion-implanted layer need only be formed at a depth such that the film thickness of the semiconductor layer sufficient for the semiconductor layer to serve as a nucleus for inducing solid phase growth of the semiconductor noncrystalline film. Thus, by setting the depth at which the ion-implanted layer is formed as shallow as possible, the ion-implanted layer can be formed without using a high ion implantation energy. Furthermore, it is possible to obtain a semiconductor layer with minimal damage from ion implantation.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIGS. 5A through 5E are schematic sectional views illustrating states of a semiconductor substrate (SOI substrate) in each step of the manufacturing process according to a third preferred embodiment;

FIGS. 11A through 11F are schematic sectional views illustrating states of a semiconductor substrate in each step of the manufacturing process;

FIG. 12 is a block diagram of a manufacturing process according to a sixth preferred embodiment of the invention;

DETAILED DESCRIPTION OF THE PREFERRED EMBODIMENTS (First Preferred Embodiment)

A first preferred embodiment of the invention applied to the manufacture of a SOI (Silicon On Insulator) substrate wherein a thick film silicon monocrystalline layer is formed on a silicon substrate, with an insulating film interposed therebetween, will now be described with reference to FIG. 1 and FIGS. 2A through 2F.

Figure 2A:
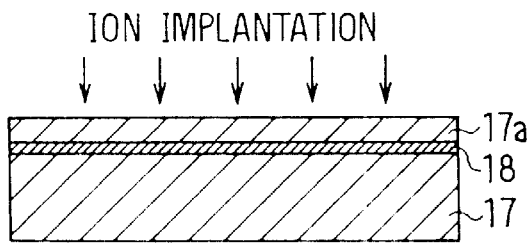
FIGS. 2A through 2F are schematic sectional views illustrating states of a semiconductor substrate in each step of the manufacturing process.
Figure 2B:
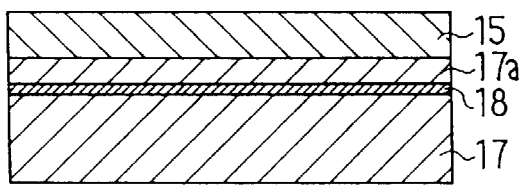
Figure 2C:
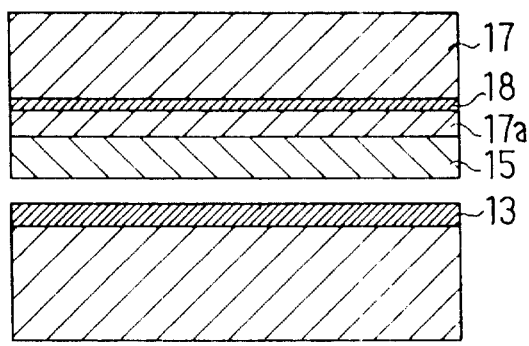
Figure 2D:
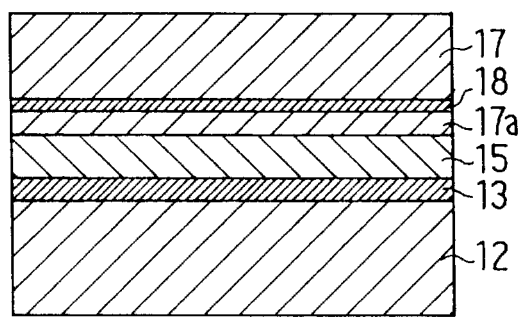
Figure 2E:
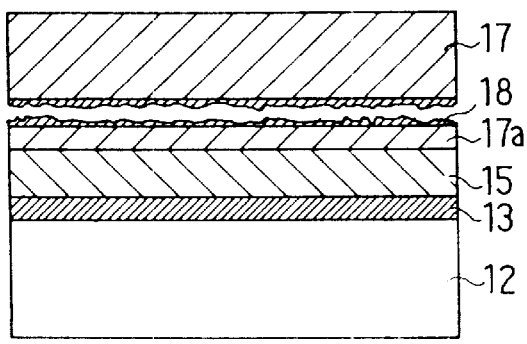
Figure 2F:
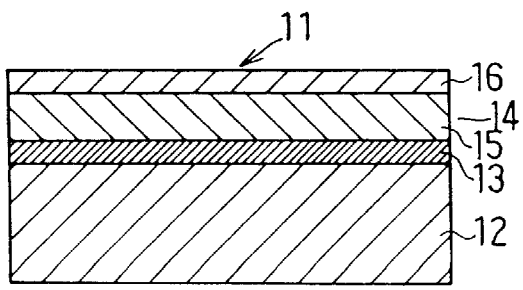

A semiconductor substrate (SOI substrate) 11 manufactured according to the present preferred embodiment, as shown in FIG. 2F, has a monocrystalline silicon semiconductor layer 14 for device formation on a silicon supporting substrate 12 with an insulating film 13 of, for example, silicon oxide interposed therebetween. This semiconductor layer 14 has a high film thickness (for example several micrometers to several tens of micrometers), and can be used in, for example, power devices and surface micromachines. As will be discussed in more detail later, the semiconductor layer 14 is made up of an epitaxial layer 15 consisting of a monocrystalline semiconductor film constituting the majority of the semiconductor layer 14 and an extremely thin film layer 16 on the surface of the epitaxial layer 15.

Figure 1:
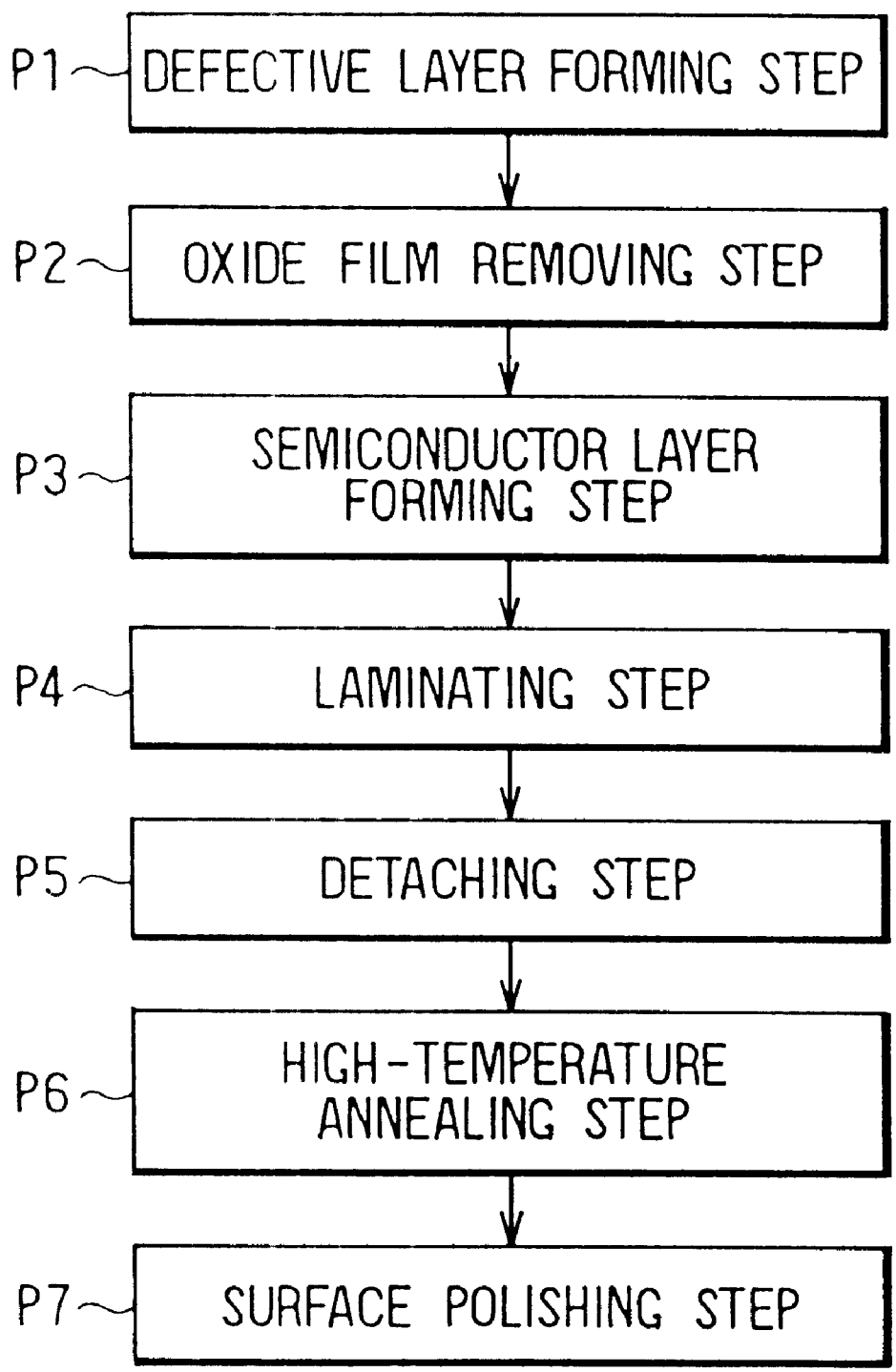
FIG. 1 is a block diagram of a semiconductor substrate manufacturing process according to a first preferred embodiment of the invention.

A method for manufacturing this semiconductor substrate 11 will now be described. FIG. 1 is a block diagram of a process for manufacturing a semiconductor substrate 11 according to the present preferred embodiment. First, in a step P1, a defective layer forming step is carried out. In this step P1, as shown in FIG. 2A, for example, ions obtained by ionizing hydrogen gas are accelerated with a predetermined implantation energy and implanted into a surface part of a base substrate 17 consisting of a monocrystalline silicon substrate. Here, the ion implantation is carried out at a low energy (for example 150 keV) so as to form an ion-implanted layer (defective layer) at a relatively shallow position. Consequently, it is possible to use a relatively cheap and general-purpose ion-implanting apparatus having a small electric current capacity.

As a result, a defective layer 18 for detachment use is formed by the implanted ions at a predetermined depth position (for example 1 μm from the surface). Also, an extremely thin monocrystalline thin film layer 17a (later to become the thin film layer 16) consisting of monocrystalline silicon is formed at the surface of the base substrate 17, partitioned from the rest of the base substrate 17 by the defective layer 18. The thickness of the base substrate 17 as a whole in the initial state (before it is reused) is for example about 600 μm.

Although it is not shown in the drawings, an oxide film for, to the extent possible, preventing contamination at the time of the ion implantation is formed on the surface of the base substrate 17, and the ion implantation is carried out through this oxide film. After the defective layer 18 is formed by the ion implantation, in a step P2, this oxide film is removed by, for example, wet etching of the surface of the base substrate 17.

In a step P3 which follows, a semiconductor layer forming step of depositing a monocrystalline semiconductor film of a predetermined thickness on the monocrystalline thin film layer 17a at the surface of the base substrate 17 is carried out. In this preferred embodiment, as the method of forming the monocrystalline semiconductor film, epitaxial growth using a molecular beam epitaxy apparatus (MBE apparatus) is used. In this way, as shown in FIG. 2B, monocrystalline silicon is grown on the monocrystalline thin film layer 17a in alignment with the crystal axis thereof, and an epitaxial layer 15 serving as a monocrystalline semiconductor film is thereby formed to a predetermined thickness (for example a few tens of micrometers).

At this time, in this preferred embodiment, the epitaxial growth is carried out at a relatively low temperature (for example below 500° C.). By using an MBE apparatus, it is possible to form a highly pure epitaxial layer 15 at a low temperature. In this way, it is possible to prevent implanted ions (hydrogen ions) desorbing from the defective layer 18 of the base substrate 17, that is, maintain the defective layer 18 inside the base substrate. Furthermore, even if some impurity contamination occurs in the monocrystalline thin film layer 17a along with the ion implantation, these contaminants can be prevented to the extent possible from diffusing into the epitaxial layer 15.

In a following step P4, a laminating step of laminating the base substrate 17 on which the epitaxial layer 15 has been formed to a supporting substrate (silicon substrate) 12 is carried out. In this step P4, as shown in FIG. 2C, the base substrate 17 is inverted from the state shown in FIG. 2B and laminated at the surface of the epitaxial layer 15 to a supporting substrate 12 on which an insulating film (an oxide film) 13 has been formed and which has been polished to a mirror finish. This lamination is carried out by a direct bonding method or by a known bonding method using electrostatic pressure.

For the lamination, the substrates are for example washed with a mixture ($H_2SO_4$:$H_2O_2$=4:1) of sulfuric acid ($H_2SO_4$) and hydrogen peroxide water ($H_2O_2$), washed with pure water and then spin-dried to control the amounts of water adsorbed onto the substrate surfaces before the lamination faces of the base substrate 17 and the supporting substrate 12 are directly bonded together. By this technique, the two silicon substrates 17, 12 are directly bonded together by hydrogen bonding of silane radicals formed on their surfaces and water molecules adsorbed onto their surfaces.

In this way, as shown in FIG. 2D, a state wherein an epitaxial layer 15, a monocrystalline thin film layer 17a, a defective layer 18 and a bulk (or remaining) part of the base substrate 17 are stacked on an insulating film 13 on a supporting substrate 12 is reached.

Then, in a step P5, a detaching step for detaching the base substrate 17 laminated to the supporting substrate 12 at the defective layer 18 is carried out. This step P5 is based on the fact that when heat treatment is carried out at a high temperature of for example 1000° C., cracking occurs at the defective layer 18 inside the base substrate 17, as shown in FIG. 2E. By cracking the defective layer 18, the monocrystalline thin film layer 17a and the epitaxial layer 15 provided on the defective layer 18 of the base substrate 17 are detached from the bulk (or remaining) of the base substrate 17 and transferred to the supporting substrate 12 side. As a result, a semiconductor substrate 11 having a semiconductor layer 14 (the epitaxial layer 15 and the thin film layer 16) of an amply high film thickness on an insulating film 13 on a supporting substrate 12 is obtained.

After that, in a step P6, on the semiconductor substrate 11 thus obtained, high-temperature annealing is carried out at a temperature of for example 800° C. or above. By annealing, recovery of the defective layer at the detachment face, strengthening of the direct bonding, removal of surface oxides and partial flattening accompanying silicon flow are achieved. Then, in a step P7, surface polishing of the detachment face is carried out to remove irregularities in the detachment face and complete the semiconductor substrate 11 shown in FIG. 2F.

Although it is not shown in the drawings, the base substrate 17 side from which the monocrystalline thin film layer 17a was detached in step P5 has its detachment face polished and is used in the manufacture of another semiconductor substrate 11. In this case, the thickness of the base substrate 17 consumed as a result of a single use is not more than 2 μm, and a single base substrate 17 can therefore be reused many times.

With this preferred embodiment, a semiconductor substrate 11 which has a semiconductor layer 14, formed on an insulating film 13 of a supporting substrate 12, of an amply high film thickness suitable for use in a power device or a surface micromachine or the like can be obtained. Because the thick semiconductor layer 14 is made up of an epitaxial layer 15 formed by epitaxial growth in the semiconductor film forming step P3 and a thin film layer 16, the monocrystalline thin film layer 17a detached from the base substrate 17 can be made extremely thin. In other words, it is possible to make the depth of the ion implantation in the defective layer forming step P1 (the depth at which the defective layer 18 is formed) small, irrespective of the thickness of the semiconductor layer 14.

Consequently, in contrast to the related art wherein to make the film thickness of the monocrystalline silicon layer 14 large it has been necessary to make the ion implantation depth large, in this process a thick semiconductor layer 14 it can be made while keeping the energy of the ion implantation in the defective layer forming step P1 low. Consequently, in this manufacturing method, it is not necessary to use an expensive ion implantation apparatus. Also, contamination of the monocrystalline thin film layer 17a by heavy metals and the like can be kept extremely low. Therefore, an epitaxial layer 15 consisting of a high-quality monocrystalline silicon film can be obtained by epitaxial growth. Furthermore, the overall process can be kept simple.

In particular, in this preferred embodiment, in the defective layer forming step P1, because the ion implantation is carried out with an oxide film formed on the surface of the base substrate 17, contamination by impurities such as heavy metals during the ion implantation can be suppressed. Also, the semiconductor layer forming step P3 is carried out at a low temperature such that the diffusion of impurities from the monocrystalline thin film layer 17a into the epitaxial layer 15 is suppressed. Therefore, even if some impurity contamination of the monocrystalline thin film layer 17a occurs at the time of the ion implantation, these contaminants can be prevented to the utmost from diffusing into the epitaxial layer 15.

As a result, with a semiconductor substrate 11 manufacturing method according to this preferred embodiment, it is possible to obtain a thick semiconductor layer 14 with a simple process and cheaply. Furthermore, the crystallographic quality of the semiconductor layer 14 can be made amply high. And also it is possible to greatly increase the number of times that the base substrate 17 can be reused.

(Second Preferred Embodiment)

Next, a second preferred embodiment of the invention will be described with reference to FIG. 3 and FIGS. 4A through 4E. This preferred embodiment also is an embodiment of the invention applied to the manufacture of a SOI (Silicon On Insulator) substrate wherein a thick film silicon monocrystalline layer is formed on a silicon substrate with an insulating film interposed therebetween. Parts in this second embodiment that are the same as parts in the first preferred embodiment have been given the same reference numerals and will not be described in detail here, and mainly points of difference of the second preferred embodiment will be described.

Figure 4A:
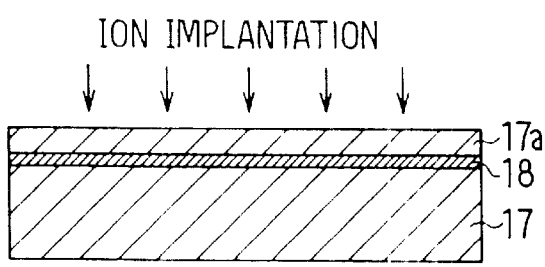
FIGS. 4A through 4E are schematic sectional views illustrating states of a semiconductor substrate in each step of the manufacturing process.
Figure 4B:
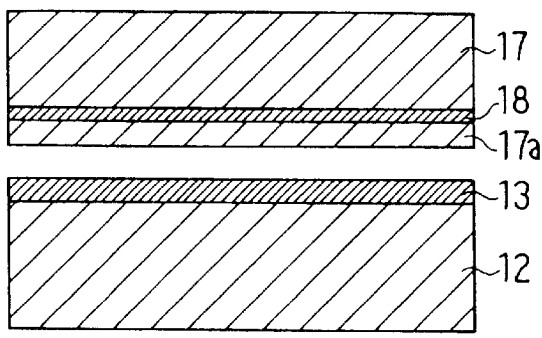
Figure 4C:
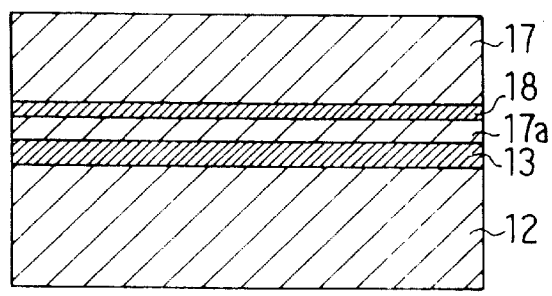
Figure 4D:
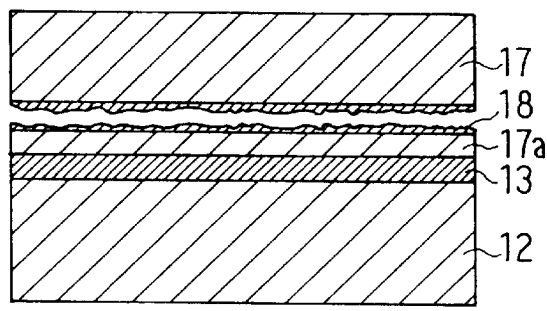
Figure 4E:
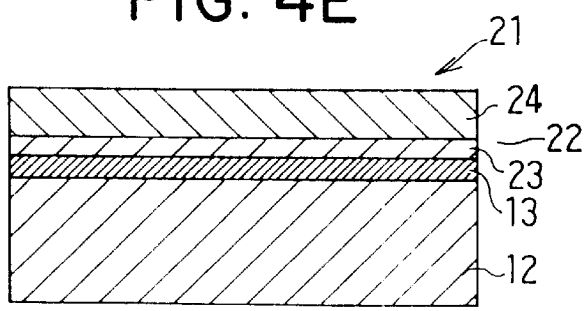

A semiconductor substrate (SOI substrate) 21 manufactured according to the method of this preferred embodiment, as shown in FIG. 4E, has a monocrystalline silicon semiconductor layer 22 for device formation on an insulating film 13 of, for example, silicon oxide on a silicon supporting substrate 12. This semiconductor layer 22 has a high film thickness (for example several micrometers to several tens of micrometers), and can be used in, for example, power devices and surface micromachines. The semiconductor layer 22 is made up of an extremely thin film layer 23 and an epitaxial layer 24 consisting of a monocrystalline semiconductor film and constituting the majority of the semiconductor layer 22.

Figure 3:
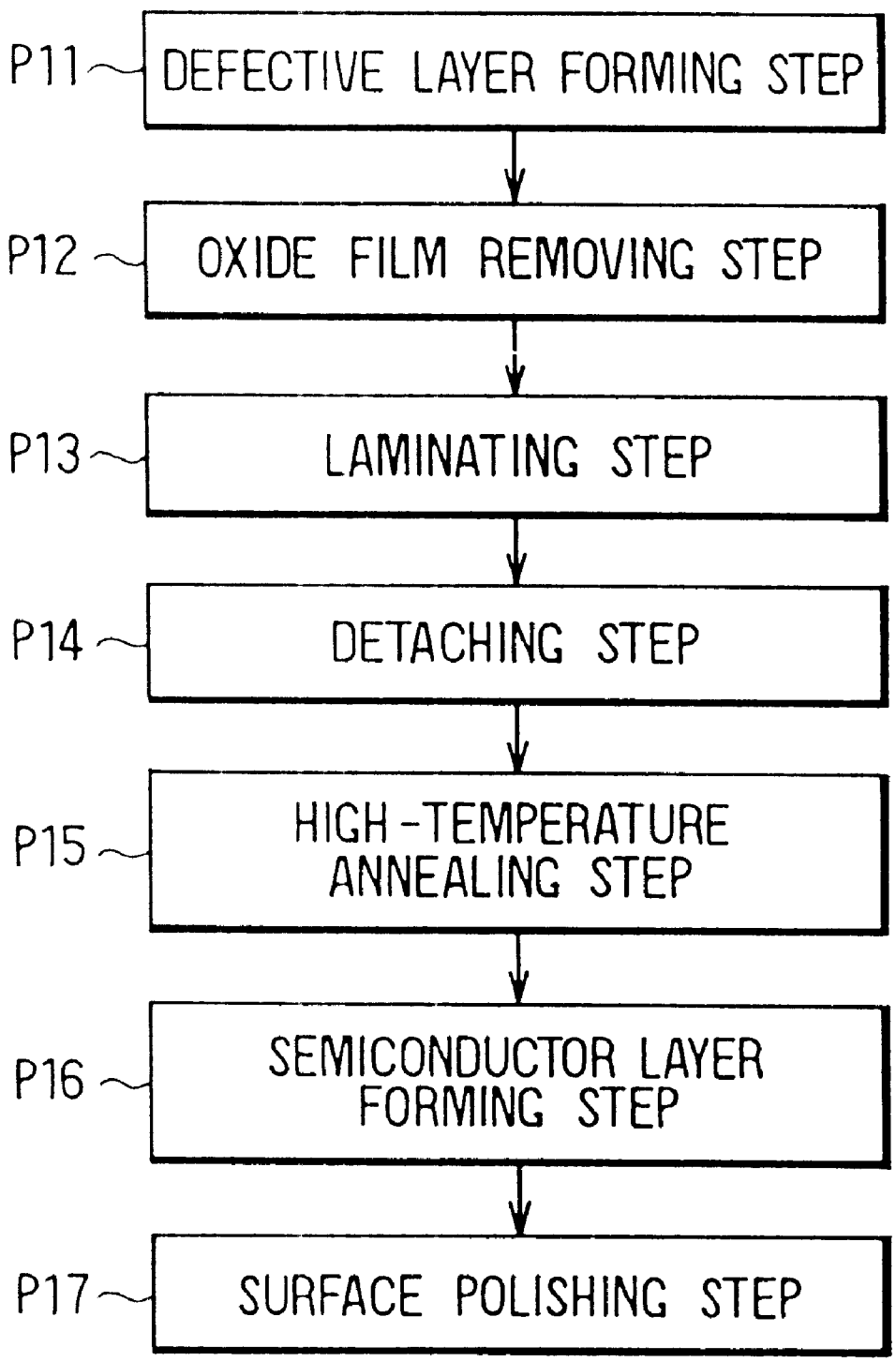
FIG. 3 is a block diagram of a semiconductor substrate manufacturing process according to a second preferred embodiment of the invention.

FIG. 3 is a block diagram of a process for manufacturing a semiconductor substrate 21 according to this preferred embodiment. First, in a step P11, a defective layer forming step is carried out. In this step P11, in the same way as in the step P1 of the first preferred embodiment, ion implantation of hydrogen gas is carried out into a base substrate 17 consisting of a monocrystalline silicon substrate having an oxide film (not shown) formed on its surface. By this step P11, as shown in FIG. 4A, a defective layer 18 for detachment use is formed at a predetermined depth (for example 1 $\mu$m from the surface) in the base substrate 17. Also, an extremely thin monocrystalline thin a film layer 17a consisting of monocrystalline silicon (later to become the thin film layer 23) is formed at the surface of the base substrate 17, partitioned from the rest of the base substrate 17 by the defective layer 18. In a step P12, the oxide film is removed by, for example, wet etching of the surface of the base substrate 17.

In a following step P13, a laminating step of laminating the base substrate 17 to a supporting substrate 12 is carried out. In this step P13, as shown in FIG. 4B, the base substrate 17 is directly bonded at the surface of the monocrystalline thin film layer 17a to a supporting substrate 12 on which an insulating film 13 has been formed in advance.

For the lamination, the substrates are for example washed with a mixture ($H_2SO_4$:$H_2O_2$=4:1) of sulfuric acid ($H_2SO_4$) and hydrogen peroxide water ($H_2O_2$), washed with pure water and then spin-dried to control the amounts of water adsorbed onto the substrate surfaces before the lamination faces of the base substrate 17 and the supporting substrate 12 are directly bonded together. The two silicon substrates 17, 12 are directly bonded together by hydrogen bonding of silane radicals formed on their surfaces and water molecules adsorbed onto their surfaces.

In this way, as shown in FIG. 4C, a state wherein a monocrystalline thin film layer 17a, a defective layer 18 and a bulk part of the base substrate 17 are stacked on an insulating film 13 on a supporting substrate 12 is reached.

Then, in a step P14, a detaching step for detaching the base substrate 17 laminated to the supporting substrate 12 at the defective layer 18 by performing a high-temperature heat treatment is carried out. The monocrystalline thin film layer 17a provided above the defective layer 18 of the base substrate 17 is detached from the base substrate 17 and transferred to the supporting substrate 12 side. As a result, a semiconductor substrate 12 having on its upper face a monocrystalline silicon thin film layer 23 on an insulating film 13 is obtained. Then, in a step P15, high-temperature annealing is carried out on the supporting substrate 12. This high-temperature annealing is carried out in an epitaxy apparatus. By this technique, recovery of the defective layer at the detachment face, strengthening of the direct bonding, removal of surface oxides and flattening accompanying silicon flow are achieved.

Then, in a step P16, a semiconductor layer forming step of depositing an epitaxial layer 24 consisting of a monocrystalline semiconductor film of a predetermined thickness (for example several tens of micrometers) on the thin film layer 23 on the surface of the supporting substrate 12 by epitaxial growth as shown in FIG. 4E in an epitaxy apparatus is carried out. In this case also, the epitaxial growth is carried out at a relatively low temperature so that even if some impurity contamination of the thin film layer 23 (the monocrystalline thin film layer 17a) has occurred, these contaminants do not diffuse into the epitaxial layer 24.

After that, in a step P17, a step of polishing the surface of the epitaxial layer 24 is carried out. By polishing, irregularities in the surface of the epitaxial layer 24 are removed and the semiconductor substrate 21 is completed. This step P17 need only be carried out as necessary, according to the state of the surface of the epitaxial layer 24. The base substrate 17 from which the monocrystalline thin film layer 17a was detached in the detaching step P14 has its surface polished and is used again in the manufacture of the next semiconductor substrate 21.

With a semiconductor substrate manufacturing method according to this preferred embodiment, as in the first preferred embodiment, it is possible to obtain a thick semiconductor layer 22 with a simple process and cheaply. Furthermore, the quality of the semiconductor layer 22 can be made amply high. Also, it is possible to greatly increase the number of times that the base substrate 17 can be reused.

In this second preferred embodiment, the semiconductor film forming step P16, that is, the step of forming the epitaxial layer 24, is carried out at a relatively low temperature. Therefore, diffusion of impurities from the thin film layer 23 can be prevented.

Also, although in the preferred embodiments described above an MBE apparatus was employed as the epitaxy apparatus, a CVD reactor may alternatively be used. In this case, a reactor in which a high vacuum can be obtained and which has a cleaning mechanism such that hydrogen adsorbed to the substrate surface can be removed on the spot is preferably used. As the process gas, disilane or dichlorosilane or the like can be used.

In the first and second preferred embodiments described above, the supporting substrate may alternatively be a ceramic substrate or a quartz substrate or the like. Also, the material used for the ion implantation is not limited to hydrogen gas, and for example noble gases such as neon and helium, or fluorine or chlorine gas can be used. Of course, the appropriate detaching temperature and temperatures of other steps will vary depending on the ion type. Also, the thicknesses of the various parts given in these preferred embodiments are merely examples and can be changed within the scope of the invention.

(Third Preferred Embodiment)

A third preferred embodiment of the invention will now be described with reference to FIGS. 5A through 5E and FIG. 6.

FIG. 5E is a schematic sectional view of a SOI semiconductor substrate 11A. In this SOI substrate 11A, a monocrystalline silicon film 15 to serve as a semiconductor layer for device formation is provided on a silicon substrate 12 serving as a supporting substrate. A silicon oxide film 13 serving as an insulating film is formed between the silicon substrate 12 and the monocrystalline silicon film 15, and SOI (Silicon On Insulator) structure is thereby realized. The monocrystalline silicon film 15, as will be further discussed later, consists of an epitaxial layer formed by epitaxial growth on a monocrystalline silicon layer therebelow, and is a crystallographically undamaged, good-quality monocrystalline silicon layer.

In this SOI substrate 11A, various devices are subsequently formed in the monocrystalline silicon film 15 through device formation steps. By this means, a circuit can be formed in such a state that it is insulated from the silicon substrate 12, and a semiconductor substrate having superior electrical characteristics can be obtained. Also, because the substrate has a SOI structure, timestaking processing steps such as insulating, separating, and diffusing steps for forming device formation regions prior to the device formation steps are unnecessary.

A method for manufacturing this SOI substrate 11A will now be described.

Figure 6:
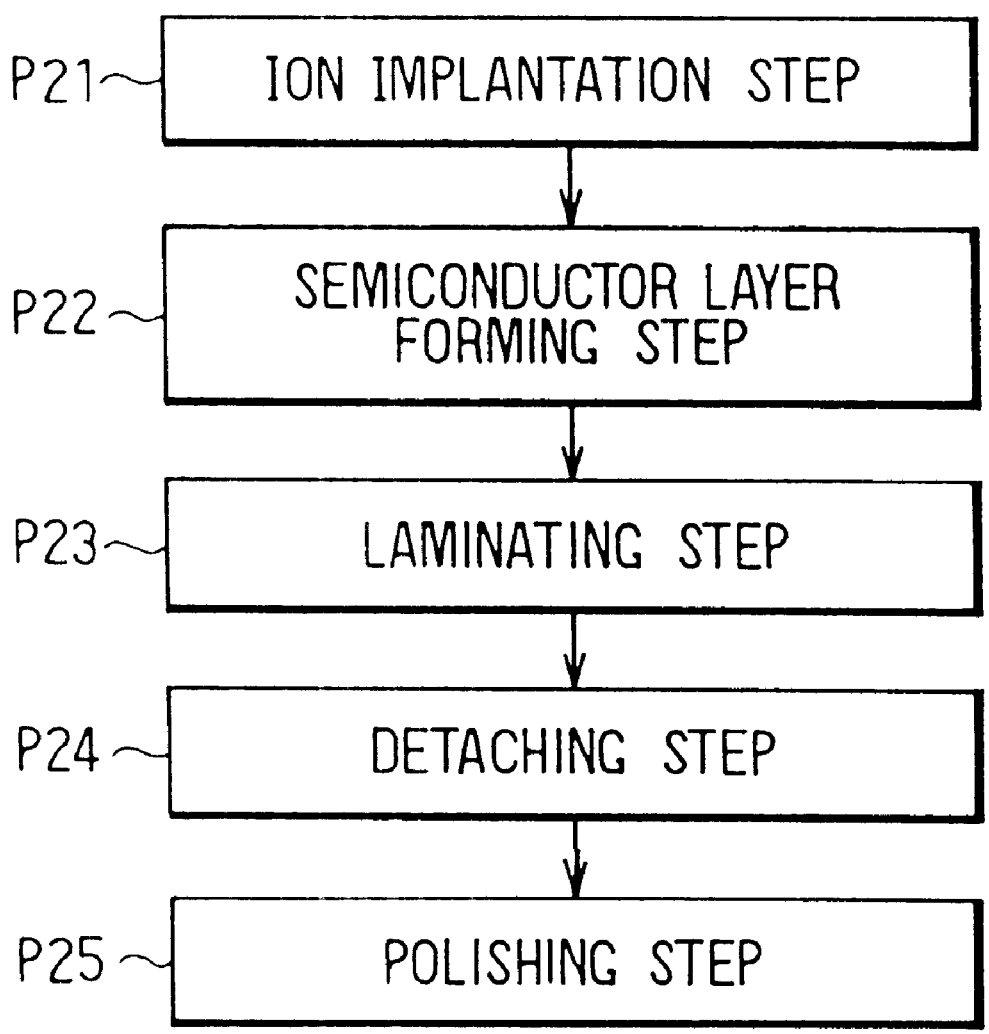
FIG. 6 is a block diagram of the manufacturing process according to the third preferred embodiment.

FIG. 6 is a block diagram showing the flow of an overall process for manufacturing the SOI substrate 11A.

First, in an ion implantation step P21, hydrogen ions H⁺ (protons) are implanted with a predetermined acceleration energy into one face of a base substrate 17 for forming a thin film semiconductor layer. An ion-implanted layer 18 is thereby formed at an extremely shallow depth (of for example less than 0.1 $\mu$m) from the surface of the base substrate 17. In consideration of the quality of a monocrystalline silicon film 15 to be formed in a following step P22, a base substrate 17 having a predetermined level of crystallinity is used.

FIG. 5A is a schematic sectional view of a monocrystalline silicon substrate 17 serving as a base substrate for forming a thin film semiconductor layer, and shows the state of the base substrate 17 after ion implantation has been carried out through its surface. In this case, the ion implantation is preferably carried out with an oxide film formed in advance on the surface of the base substrate 17 to prevent contamination caused by the ion implantation.

Next, in a semiconductor layer forming step P22, a monocrystalline silicon film 15 is formed on the surface of the base substrate 17. In this case, the film is formed by for example MBE (Molecular Beam Epitaxy) (see FIG. 5B). The film-formation temperature at this time is below 500° C. and can be, for example, about 400° C., which is lower than the temperature at which hydrogen ions implanted in the ion implantation step P21 desorb (the desorption temperature).

In other words, by using MBE, with which low-temperature film-formation is possible, a monocrystalline silicon film 15 can be formed as a semiconductor layer without implanted hydrogen ions being caused to desorb. Before the epitaxial layer to serve as the monocrystalline silicon film 15 is formed, the silicon oxide film (not shown) for preventing contamination during the ion implantation is removed by wet etching.

Instead of MBE, the monocrystalline silicon film 15 can alternatively be formed by CVD. In this case, a CVD lack reactor having the capability of cleaning the face of the base substrate 17 on which the epitaxial layer to serve as the monocrystalline silicon film 15 is to be formed with the base substrate 17 loaded into the reactor is used, and for example disilane or dichlorosilane or the like is used as the process gas.

In the semiconductor layer forming step P22, epitaxial growth is carried out with a surface part (a damage layer) 17a of the monocrystalline silicon substrate 17 which was damaged by the ion implantation as a crystal lattice source. However, at this time the damage that the surface part 17a has suffered consists mainly of crystallographic point defects, and this does not directly lower the crystallinity of the epitaxial layer. That is, when the epitaxial growth is carried out, any dislocations or the like affecting the crystal quality of the monocrystalline silicon film 15 originate in the initial quality of the base substrate 17. Therefore, by using a monocrystalline silicon substrate 17 whose quality is above a certain standard, it is possible to ensure that the quality of the monocrystalline silicon film 15 obtained by the epitaxial growth will also be good.

Then, in a laminating step P23, the face on the monocrystalline silicon film 15 side of the monocrystalline silicon substrate 17 and a silicon substrate 12 are washed in a pretreatment step and then laminated together for example by being heat-treated at a temperature of about 500° C. At this time, a silicon oxide film 13 to serve as an insulating film has been formed in advance on the surface of the silicon substrate 12 to be laminated to the monocrystalline silicon substrate 17.

For the lamination, the substrates are for example washed with a mixture ($H_2SO_4$:$H_2O_2$=4:1) of sulfuric acid ($H_2SO_4$) and hydrogen peroxide water ($H_2O_2$), washed with pure water and then spin-dried to control the amounts of water adsorbed onto the substrate surfaces before the lamination faces of the monocrystalline silicon substrate 17 and the silicon substrate 12 are directly bonded together. The two silicon substrates 17, 12 are directly bonded together by hydrogen bonding of silane radicals formed on their surfaces and water molecules adsorbed onto their surfaces.

Then, in a detaching step P24, heat treatment is carried out at a high temperature and detachment of the monocrystalline silicon substrate 17 is effected with the ion-implanted layer 18 as a defective layer for detachment. The heat treatment at this time is carried out both to raise the bond strength of the interface between the laminated substrates 17, 12 and to effect a detachment. Preferably, the heat treatment temperature is above 1100° C. and more preferably about 1150° C., and the heat treatment time is about sixty minutes. As a result, bonding to the silicon substrate 12 and detachment at the defective layer where the ion-implanted layer 18 was formed occur (see FIG. 5D).

Instead of the heat treatment being divided into two stages as described above, to simplify the process, the laminating step P23 and the detaching step P24 may alternatively be carried out as a single heat treatment. In this case, for example by carrying out heat treatment at a temperature of over 1100° C. and preferably about 1150° C. for about sixty minutes it is possible to effect bonding of the two silicon substrates 17, 12 and detachment at the defective layer region.

Because the ion-implanted layer 18 formed in the ion implantation step P21 (i.e., the defective layer for detachment) is extremely thin, the detachment face P has a surface roughness of not more than a few nanometers. Consequently, it is possible to form a flat surface easily in a subsequent detachment face polishing step P25. In this detachment face polishing step P25, in addition to the detachment face P being flattened and smoothed, polishing is carried out until the monocrystalline silicon film 15 becomes exposed and the surface layer part 17a of the monocrystalline silicon substrate 17 is completely removed.

The the surface layer part 17a of the monocrystalline silicon substrate 17 is removed because surface layer part 17a has suffered a certain amount of damage in the ion implantation step P1. In other words, this surface layer part 17a is removed after serving as a seed for forming the monocrystalline silicon film 15 by epitaxial growth. As a result, a SOI substrate 11A is obtained wherein a monocrystalline silicon film 15 of superior quality is formed to a predetermined thickness by epitaxial growth on a silicon oxide film 13 on a silicon substrate 12.

In the technology of effecting the detachment at the ion-implanted layer 18, hydrogen ions implanted into the monocrystalline silicon substrate 17 are distributed in a state such that the ions give rise to faults in the crystal lattice or distort the crystal lattice of the monocrystalline silicon substrate 17. At this time, with respect to the target depth the hydrogen ions are actually spread over a depth range. However, where the amount of implanted hydrogen ions exceeds a fixed amount (the threshold value), in the state immediately before the detachment, as a result of going through heat treatment, the defective layer region is condensed to an extremely narrow region of a few tens of nanometers to a few nanometers in thickness.

When making a SOI substrate 11A according to this preferred embodiment, for the monocrystalline silicon substrate 17, to ensure quality of the monocrystalline silicon film 15, a wafer whose impurity concentration has been controlled to a fixed value and of which crystallinity has been secured in the same way as one used for forming an ordinary semiconductor device is preferably used. For the silicon substrate 12, on the other hand, because it only needs to perform the function of a substrate for holding the monocrystalline silicon substrate 15 with the oxide film 13 therebetween, a dummy wafer whose impurity concentration has not been strictly controlled can be used and cost reductions thereby made.

Consequently, the thickness of the monocrystalline silicon substrate 17 consumed to manufacture one SOI substrate 11A is equivalent to the total of the thickness necessary to constitute a seed for forming the monocrystalline silicon film 15 and the thickness corresponding to the depth at which the defective layer for detachment is formed. That is, essentially only an extremely thin layer of the monocrystalline silicon substrate is consumed. Therefore, by flattening the detachment face P of the bulk part of the silicon substrate 17 remaining after the detachment, it is possible to reuse the monocrystalline silicon substrate 17 for manufacturing other SOI substrates 11A again and again, whereby resources can be used effectively and overall cost reductions can be achieved.

Although in the third preferred embodiment described above hydrogen ions were used to form the defective layer, ions obtained by ionizing a noble gas may alternatively be used, or ions of another element may be used. Also, in this case, if the desorption temperature of the implanted element is high, it becomes possible to raise the heat treatment temperature when forming the epitaxial layer 15. However, if this temperature is set too high, contamination from the ion implanted region formed as a result of the ion implantation tends to diffuse into adjacent layers. Therefore, in consideration of the quality of the epitaxial layer 15, the temperature must be set in a suitable range.

Monocrystalline materials based on group four elements other than silicon can also be used as the material of the base substrate for forming the thin film semiconductor layer. For example Ge (germanium), SiC (silicon carbide), SiGe (silicon germanium), or diamond or the like can be used for the base substrate. In this case, when a SiC substrate or the like is used, because the substrate itself is extremely expensive, the effective use of resources and cost reduction effect of polishing and reusing the substrate after its detachment are great.

The supporting substrate does not have to be a silicon substrate like the silicon substrate 12 and may be another semiconductor substrate or a ceramic substrate, and the supporting substrate itself may have insulating property. In this case, because the supporting substrate itself has insulating property, it is not necessary to form an insulating film such as the silicon oxide film 13 separately as is done in this preferred embodiment.

(Fourth Preferred Embodiment)

A fourth preferred embodiment of the invention will now be described with reference to FIGS. 7A to 7D through FIG. 9.

Figure 7A:
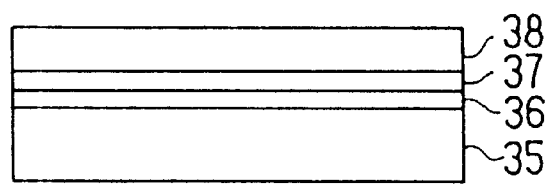
FIGS. 7A through 7D are schematic sectional views illustrating states of a semiconductor substrate in each step of a manufacturing process according to a fourth preferred embodiment.
Figure 7B:
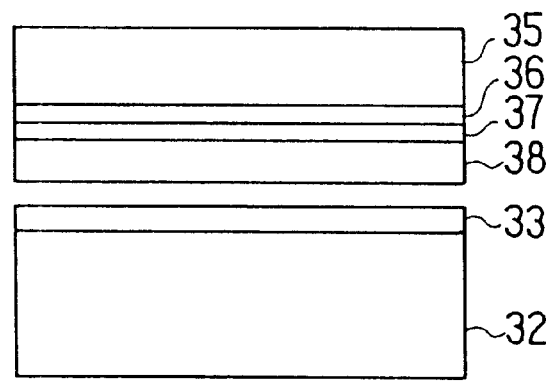
Figure 7C:
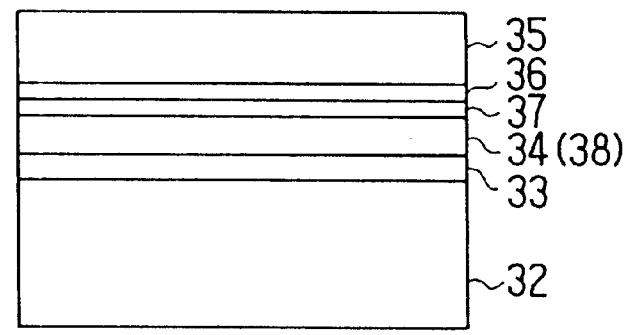
Figure 7D:
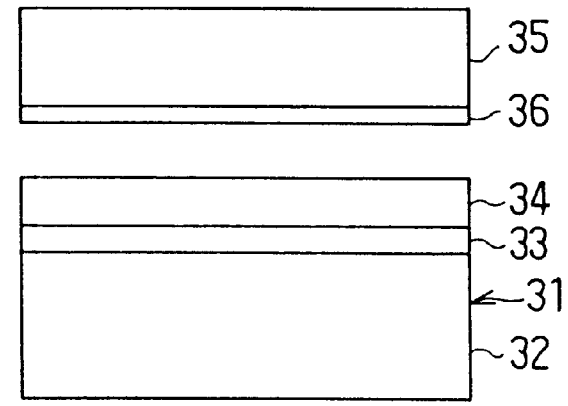

In this preferred embodiment, a method for manufacturing a SOI semiconductor substrate 31 shown in FIG. 7D is described. This SOI substrate 31 has a construction wherein a monocrystalline silicon film 34 constituting a thin film semiconductor layer is formed on an oxide film 33 serving as an insulating film on a silicon substrate 32 serving as a supporting substrate. In this case, the monocrystalline silicon film 34 is formed to a thickness of several tens of micrometers. This SOI substrate 31 is suitable for example for power devices or devices made by forming microactuators in the surface of the monocrystalline silicon film 34.

Figure 8:
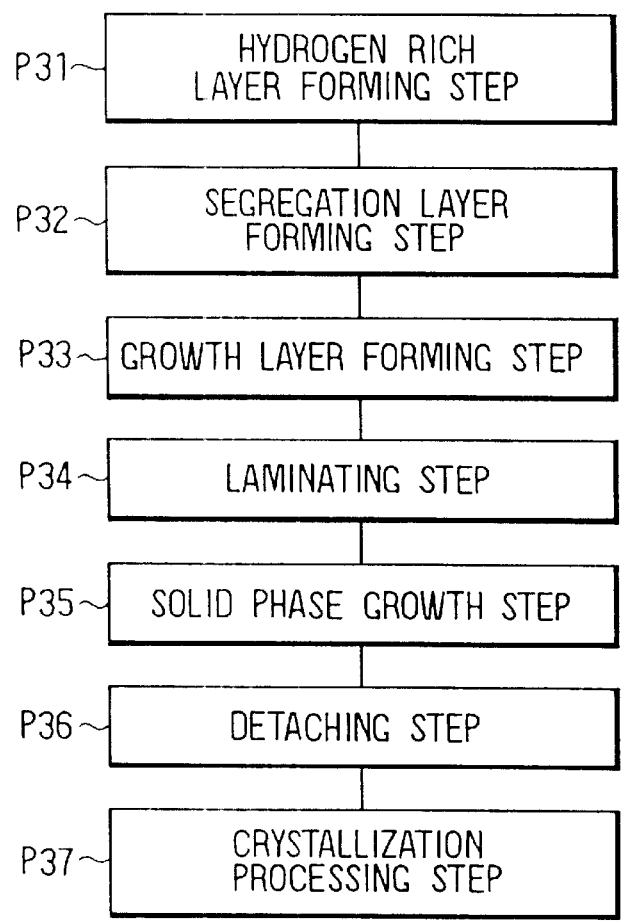
FIG. 8 is a block diagram of the manufacturing process according to the fourth preferred embodiment.

Next, a method for manufacturing this SOI substrate 31 will be described. As shown in FIG. 8, this process is divided into seven steps: a hydrogen rich layer forming step P31, a segregation layer forming step P32, a growth layer forming step P33, a laminating step P34, a solid phase growth step P35, a detaching step P36 and a crystal completion processing step P37.

First, in the hydrogen rich layer forming step P31, a hydrogen rich layer 36 is formed on a monocrystalline silicon substrate 35 serving as a base semiconductor substrate for forming a thin film semiconductor layer. As the hydrogen rich layer 36, specifically, for example a hydrogenated amorphous silicon film (hereinafter abbreviated to 'α-Si:H film') formed to a predetermined film thickness on the monocrystalline silicon substrate 35 by plasm CVD (Chemical Vapor Deposition) is used. This hydrogenated amorphous silicon film consists of amorphous silicon having had hydrogen accumulated into the film (see FIG. 7A).

Then, in the segregation layer forming step P32, a segregation layer 37 is formed on the hydrogen rich layer 36. In this case, as the segregation layer 37, for example an amorphous silicon carbide film (hereinafter abbreviated to 'α-SiC film') or a silicon oxide film of a film thickness such that it does not make a one atom layer is used. The α-SiC film can be formed by plasma CVD in the same way as the α-Si:H film. When a silicon oxide film is to be formed, the film can be formed by oxidizing the surface of the hydrogen rich layer 36 formed on the monocrystalline silicon substrate 35 by exposing it to a gas containing oxygen (see FIG. 7A).

Then, in the growth layer forming step P33, a growth layer 38 is formed on the segregation layer 37 (see FIG. 7A). In this case, as the growth layer 38, for example an amorphous silicon film (hereinafter abbreviated to 'α-Si film') containing almost no oxygen is formed by plasma CVD. This growth layer 38 is to be monocrystallized into a monocrystalline silicon film 34 in a subsequent step, and its film thickness is the same as the film thickness of the monocrystalline silicon film 34 to serve as the semiconductor layer of the SOI substrate 31; when necessary, the growth layer 38 can be formed to a film thickness of as much as 10 $\mu$m or more.

In the above-mentioned steps of forming films by plasma CVD, in the formation of the α-Si:H film silane gas or disilane gas diluted with hydrogen is used as the process gas, and in the formation of the α-Si film silane gas or disilane gas diluted with an inert gas such as argon is used as the process gas. In the formation of the α-SiC film, a gas made by adding a hydrocarbon such as methane or ethane to silane gas or disilane gas is used.

Next, in the laminating step P34, a silicon substrate 32 with an oxide film 33 serving as an insulating film formed thereon is laminated to the monocrystalline silicon substrate 35 having the film structure described above. Before this lamination, as a hydrophilicizing treatment, the substrate surfaces are for example washed with a mixture ($H_2SO_4:H_2O_2=4:1$) of sulfuric acid ($H_2SO_4$) and hydrogen peroxide water ($H_2O_2$) and then washed with pure water before the amounts of water adsorbed onto the substrate surfaces are controlled by spin drying. As a result, when the lamination faces of the monocrystalline silicon substrate 35 and the silicon substrate 32 are brought into intimate contact with each other, the two are directly bonded together by hydrogen bonding of silane radicals formed on their surfaces and water molecules adsorbed onto their surfaces.

In the solid phase growth step P35, heat treatment is carried out for a predetermined time on the monocrystalline silicon substrate 35 and the silicon substrate 32 thus laminated together at a first heat treatment temperature T1. In this step P35, the hydrogen rich layer 36 consisting of an α-Si:H film starts to undergo solid phase growth on the basis of crystal information from the monocrystalline silicon substrate 35. Simultaneously with this, hydrogen in the hydrogen rich layer 36 migrates to the segregation layer 37 side and this segregation layer 37 becomes a stopper and hydrogen accumulates in a narrow region.

After that, when the leading edge of the solid phase growth passes from the hydrogen rich layer 36 through the extremely thin segregation layer 37 and reaches the growth layer 38, the growth layer 38 consisting of an α-Si film starts to undergo solid phase growth and the growth layer 38 is thereby monocrystallized. That is, the growth layer 38 becomes a monocrystalline silicon film 34 serving as a semiconductor layer.

When the heat treatment of the solid phase growth step P35 has proceeded until the whole of the growth layer 38 has become monocrystalline, next, in the detaching step P36, the temperature is raised and heat treatment is carried out for a predetermined time at a second heat treatment temperature T2. In this detaching step P36, because a defective layer is formed by hydrogen accumulating at the segregation layer 37, when heat treatment proceeds in this state the monocrystalline silicon substrate 35 detaches at this segregation layer 37. That is, a detachment so occurs that the monocrystallized growth layer 38 part is separated from the monocrystalline silicon substrate 35 and left on the silicon substrate 32 side.

Next, in the crystal completion processing step P37, the temperature is raised still further and heat treatment is carried out for a predetermined time at a third heat treatment temperature T3. By this means, the growth layer 38 is completely monocrystallized and made a monocrystalline silicon film 34. In this step P37, there is also an effect of strengthening the bond between the monocrystalline silicon film 34 and the silicon substrate 32 at the oxide film 33.

Figure 9:
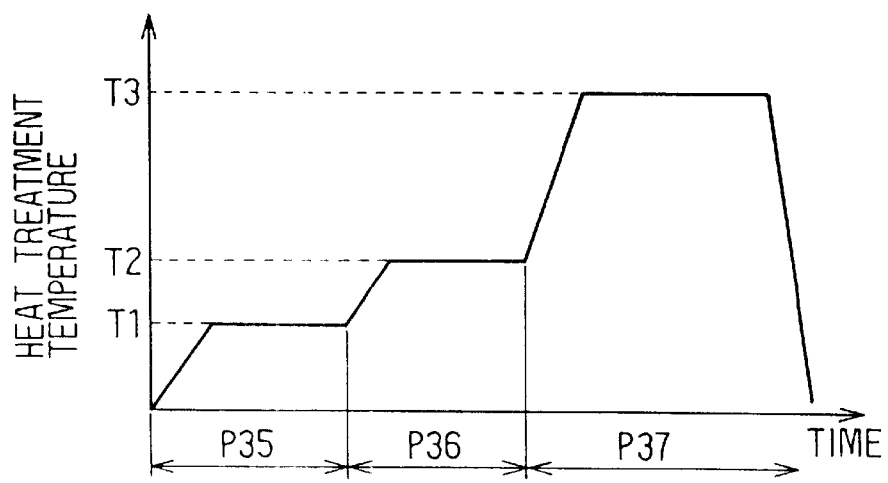
FIG. 9 is a graph showing temperature transitions in a heat treatment process.

In the heat treatments from the solid phase growth step P35 to the crystallization processing step P37, the treatment temperatures T1 through T3 and the respective treatment times are set as shown in FIG. 9, and in practice these heat treatments are carried out continuously as a series of steps.

By going through these steps P31 through P37, it is possible to obtain a SOI substrate 31 wherein a monocrystalline silicon film 34 is formed to a thickness of over 10 μm on an oxide film 33 on a supporting silicon substrate 32. In this case, the film thickness of the monocrystalline silicon film 34 is determined by the thickness to which the growth layer 38 is formed in the growth layer forming step P33.

As described above, with this preferred embodiment it is possible to form a SOI substrate 31 having a thick monocrystalline silicon film 34 without using an expensive ion implantation apparatus.

Also, with this preferred embodiment, because the monocrystalline silicon film 34 formed on the SOI substrate 31 has not suffered damage caused by ion implantation, there is also no problem of heavy metal contamination and a monocrystalline film of good quality is obtained.

Also, in this preferred embodiment, because in principle the monocrystalline silicon substrate 35 does not decrease in thickness, it can be reused any number of times. Also, for the silicon substrate 32 serving as the supporting substrate, a high-quality substrate such as that required as the monocrystalline silicon substrate 35 does not have to be employed, and a substrate made of an inexpensive material can be used.

Also, in this preferred embodiment, because the hydrogen rich layer 36, the segregation layer 37 and the growth layer 38 are formed as amorphous silicon films by plasma CVD, they can be formed in a single series of film-forming steps and a clean, simple and fast manufacturing process can be employed.

In the fourth preferred embodiment described above, monocrystalline materials based on group four elements other than silicon can also be used as the material of the monocrystalline semiconductor substrate. For example Ge (germanium), SiC (silicon carbide), SiGe (silicon germanium), or diamond or the like can be used for the monocrystalline semiconductor substrate.

The supporting substrate does not have to be a silicon substrate as in the fourth preferred embodiment and may be another semiconductor substrate or a ceramic substrate. For example, a ceramic substrate which itself is insulating can be used as the supporting substrate. In this case, it is not necessary to form an insulating film such as the silicon oxide film 33 separately as is done in this preferred embodiment.

The segregation layer forming step P32 need only be carried out as necessary. The effect of forming the segregation layer 37 is to reduce the roughness of the detachment face by causing hydrogen to accumulate with the segregation layer 37 as a stopper, and therefore this need only be carried out according to the quality and specification requirements of the SOI substrate being manufactured.

(Fifth Preferred Embodiment)

A fifth preferred embodiment of the invention will now be described with reference to FIG. 10 and FIGS. 11A through 11F.

FIG. 11F is a schematic sectional view of a SOI semiconductor substrate 41. A silicon oxide film 43 to serve as an insulating film is formed on a monocrystalline silicon substrate 42 serving as a supporting substrate, and a monocrystalline silicon film 44 to serve as a semiconductor layer for device formation is formed thereon. The monocrystalline silicon film 44 is formed to a film thickness of over 10 μm. This SOI substrate 41 is suitable for example for power devices or devices such as surface micromachines made by forming microactuators in the surface of the monocrystalline silicon film 34.

Figure 10:
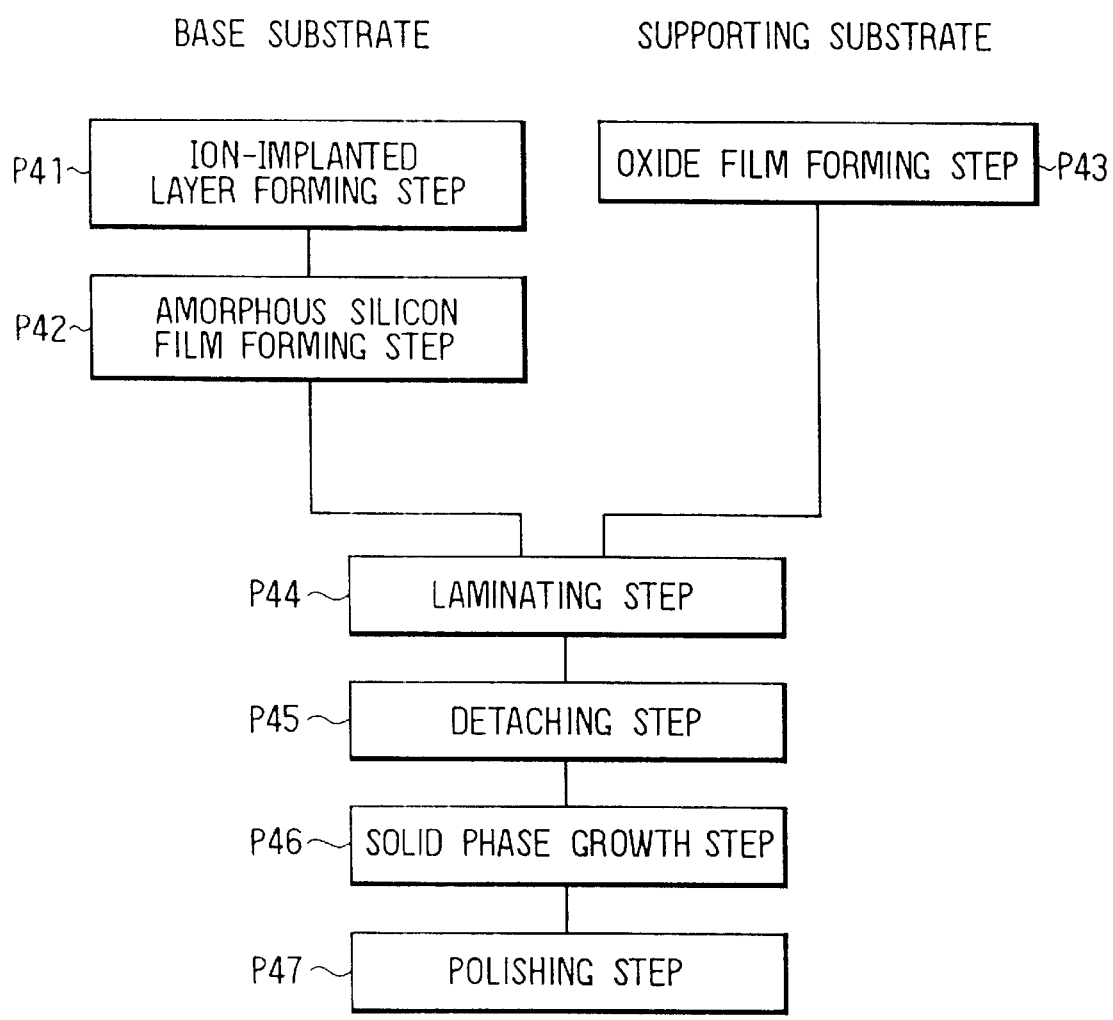
FIG. 10 is a block diagram of a manufacturing process according to a fifth preferred embodiment of the invention.

A method for manufacturing the SOI substrate 41 will now be described. As shown in FIG. 10, this manufacturing method is divided into seven steps: an ion-implanted layer forming step P41, an amorphous silicon film forming step P42, an oxide film forming step P43, a laminating step P44, a detaching step P45, a solid phase growth step P46 and a polishing step P47.

First, in the ion-implanted layer forming step P41, with an oxide film formed on a monocrystalline silicon substrate 45 serving as a base substrate for forming a thin film semiconductor layer, hydrogen ions (protons) or ions of a noble gas are implanted into the monocrystalline silicon substrate 45 through the surface on which the oxide film is formed. By implanting the ions in this way, an ion-implanted layer 46 is formed at a predetermined depth (see FIG. 11A). In this case, the ion implantation depth is for example below 2 μm. After that, the oxide film formed on the surface is removed by wet etching or the like.

Then, in the amorphous silicon film forming step P42, which is a noncrystalline film forming step, an amorphous silicon film 47 constituting a semiconductor noncrystalline film is formed on the side of the monocrystalline silicon substrate 45 in which the ion-implanted layer 46 was formed (see FIG. 11B). For example plasma CVD is used to form the amorphous silicon film 47, and the film thickness thereof is set to a film thickness (for example about 10 μm) substantially equal to the film thickness of the monocrystalline silicon film 44 finally required for the semiconductor substrate 41.

Then, in the oxide film forming step P43, an oxide film 43 is formed on the surface of a monocrystalline silicon substrate 42 serving as a supporting substrate by a method such as thermal oxidation. After that, in the laminating step P44, the monocrystalline silicon substrate 45 with the amorphous silicon film 47 formed thereon and the monocrystalline silicon substrate 42 with the oxide film 43 formed thereon are laminated together (see FIG. 11C). In this case, before the lamination, as a hydrophilicizing treatment, the surfaces of the monocrystalline silicon substrates 42 and 45 are for example washed with a mixture ($H_2SO_4:H_2O_2=4:1$) of sulfuric acid ($H_2SO_4$) and hydrogen peroxide water ($H_2O_2$) and then washed with pure water, after which the amounts of water adsorbed onto the substrate surfaces are controlled by spin drying. As a result, when the lamination faces of the monocrystalline silicon substrate 45 and the monocrystalline silicon substrate 42 are brought into intimate contact with each other, the two are adhered together by hydrogen bonding of silane radicals formed on their surfaces and water molecules adsorbed onto their surfaces.

In the detaching step P45 which follows, the monocrystalline silicon substrates 42, 45 thus laminated together are heat treated in a range of 400° C. to 600° C. to effect detachment of the monocrystalline silicon substrate 45 at a defective layer region formed by the ion-implanted layer 46, and a monosilicon film 44a is thereby formed (see FIG. 11D). Following this heat treatment for detachment, in the solid phase growth step P46, to induce solid phase growth of the amorphous silicon film 47 and to raise the strength with which the monosilicon substrates 42, 45 are bonded together, heat treatment is carried out at over 1100° C. and for example at 1150° C. for about sixty minutes. As a result, the whole of the amorphous silicon film 47 recrystallizes with the monosilicon film 44a as a nucleus and becomes monocrystalline, and a monocrystalline silicon film 44 to serve as a semiconductor layer is thereby formed (see FIG. 11E).

Instead of the heat treatments of the detaching step P45 and the solid phase growth step P46 being divided into two stages as described above, to simplify the process, the two heat treatment stages may alternatively be carried out as a single heat treatment. In this case, for example, by carrying out heat treatment at a temperature of over 1100° C. and preferably about 1150° C. for about sixty minutes it is possible to effect detachment of the two monocrystalline silicon substrates 42, 45 and induce solid phase growth of the amorphous silicon film 47 at the same time.

Because the ion-implanted layer 46 formed in the ion implantation step P41 defining the defective layer for detachment is extremely thin, the detachment face has a surface roughness of not more than a few nanometers. Consequently, it is possible to form a flat surface easily in a subsequent polishing step P47. As a result, it is possible to obtain a SOI substrate 41 wherein a monocrystalline silicon film 44 of a predetermined film thickness is formed on an oxide film 43 on a monocrystalline silicon substrate 42 (see FIG. 11F).

In this case, in this polishing step P47, in addition to the detachment face being flattened and smoothed, polishing may be carried out so that the monosilicon film 44a part formed by the detachment is removed. It is also possible to remove (by polishing) the surface layer part of the monocrystalline silicon substrate 45 damaged in the ion-implanted layer forming step P41. This surface layer part performs the function of a nucleus for making the amorphous silicon film 47 undergo solid phase growth and become the monocrystalline silicon film 44. By removing it thereafter as necessary, it is possible to form a monocrystalline silicon film 44 having no damage.

When a SOI substrate 41 is manufactured according to this preferred embodiment, for the monocrystalline silicon substrate 45, to ensure quality of the monocrystalline silicon film 44a, a wafer whose impurity concentration has been controlled to a fixed value and of which crystallinity has been secured in the same way as one used for forming an ordinary semiconductor device is preferably used. For the silicon substrate 42 serving as the supporting substrate, on the other hand, because the substrate 42 only needs to perform the function of holding the monocrystalline silicon substrate 44 with the oxide film 43 therebetween, a dummy wafer whose impurity concentration has not been strictly controlled can be used and cost reductions thereby made.

Because the thickness of the monocrystalline silicon substrate 45 consumed to manufacture one SOI substrate 41 is only the thickness necessary for forming the monocrystalline silicon film 44a, essentially only an extremely thin layer of the substrate 45 is consumed. Therefore, by carrying out a flattening process such as polishing on the detachment face of the bulk part of the monocrystalline silicon substrate 45 remaining after the detachment it is possible to reuse the monocrystalline silicon substrate 45 for manufacturing other SOI substrates 41 again and again.

(Sixth Preferred Embodiment)

FIG. 12 and FIGS. 13A through 13C show a sixth preferred embodiment of the invention, which differs from the fifth preferred embodiment in that the amorphous silicon film 47 is formed on the monocrystalline silicon substrate 42 serving as the supporting substrate.

Figure 13A:
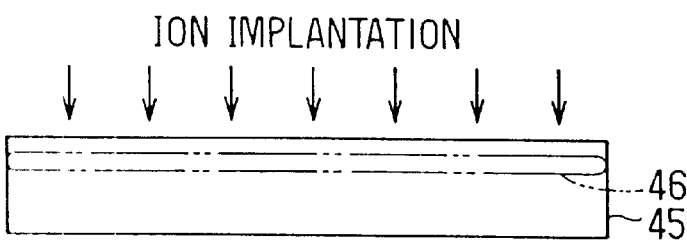
FIGS. 13A through 13C are schematic sectional views illustrating states of a semiconductor substrate in each step of the manufacturing process.
Figure 13B:
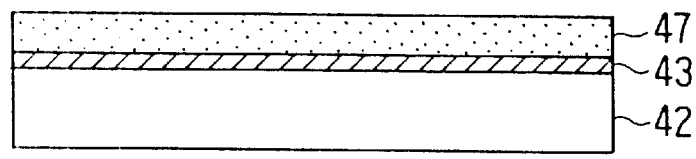
Figure 13C:
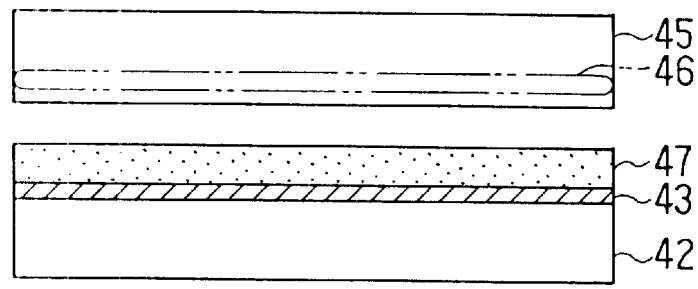
Figure 14:
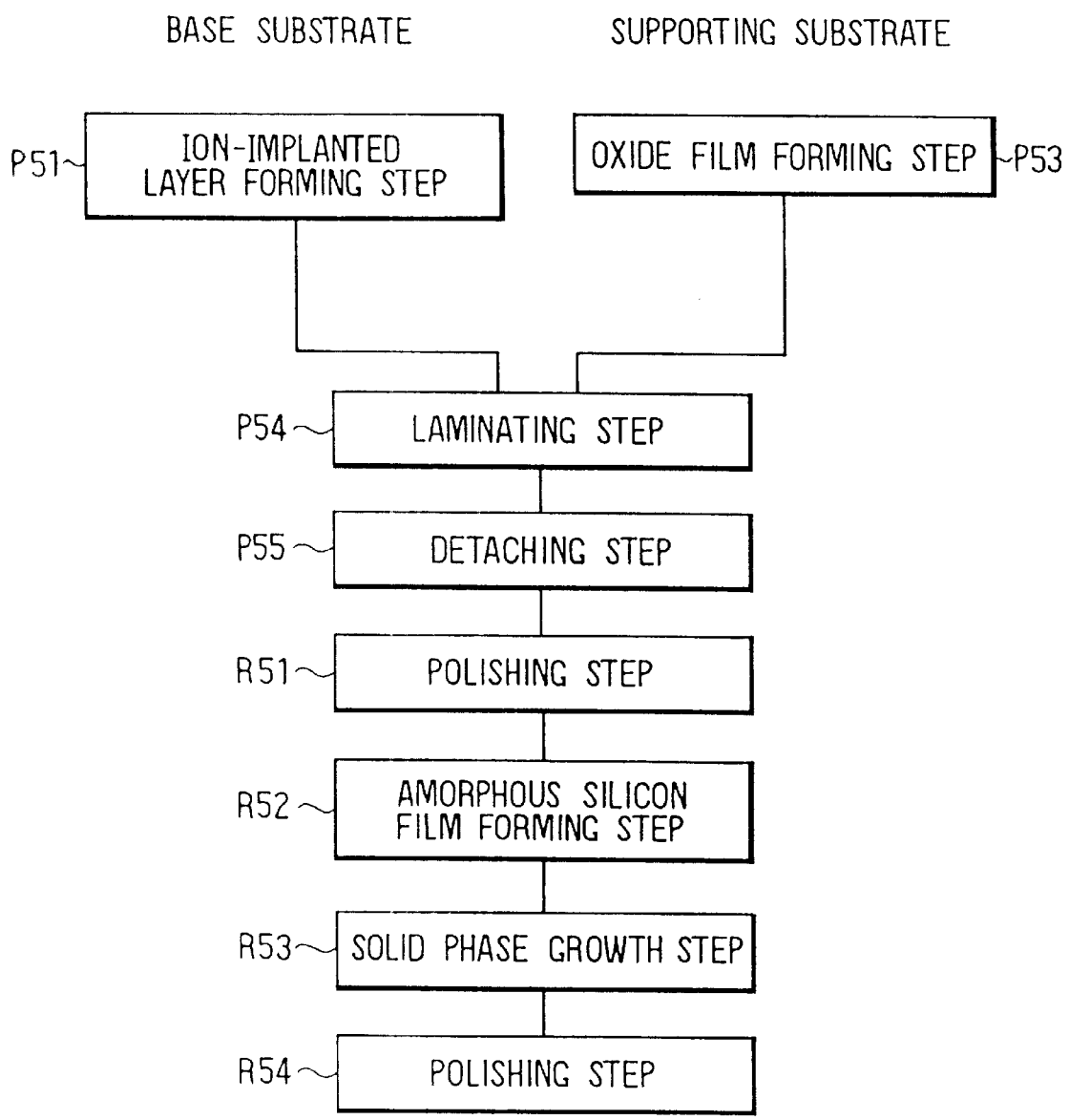
FIG. 14 is a block diagram of a manufacturing process according to a seventh preferred embodiment of the invention.

That is, in this preferred embodiment, a monocrystalline silicon substrate 45 serving as a base substrate for forming a monocrystalline silicon film 44a has an ion-implanted layer 46 formed in the ion-implanted layer forming step P41 (see FIG. 13A). Then, an oxide film 43 is formed on a monocrystalline silicon substrate 42 serving as a supporting substrate in the oxide film forming step P43, after which an amorphous silicon film 47 constituting a semiconductor noncrystalline film is formed to a predetermined film thickness on the surface of the oxide film 43 in an amorphous silicon film forming step Q41 (see FIG. 13B).

The two monosilicon substrates 45 and 42 in this state are then laminated together in the same way as that described above in the laminating step P44 (FIG. 13C). Thereafter, by the detaching step P45, the solid phase growth step P46 and the polishing step P47 being successively carried out, a SOI substrate 41 wherein a monocrystalline silicon film 44 of a predetermined film thickness is formed on an oxide film 43 on a monocrystalline silicon substrate 42 can be obtained.

With this sixth preferred embodiment also, it is possible to obtain the same effects as those of the fifth preferred embodiment.

(Seventh Preferred Embodiment)

FIG. 14 and FIGS. 15A through 15F show a seventh preferred embodiment of the invention, which differs from the fifth preferred embodiment in that an amorphous silicon film 57 serving as a noncrystalline film is formed after a detaching step P55 and solid phase growth is then carried out to form a SOI substrate 58.

Figure 15A:
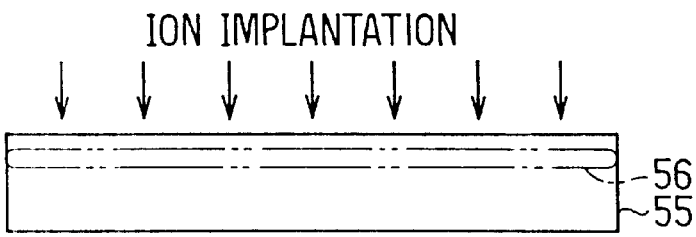
FIGS. 15A through 15F are schematic sectional views illustrating states of a semiconductor substrate in each step of the manufacturing process.
Figure 15B:
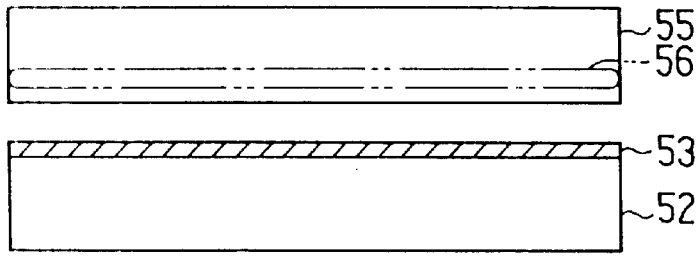

That is, in this preferred embodiment, in an ion-implanted layer forming step P51, an ion-implanted layer 56 is formed at a predetermined depth (about 2 μm or less) in a monosilicon substrate 55 (FIG. 15A), and in an oxide film forming step P53 an oxide film 53 is formed on a monosilicon substrate 52 to serve as a supporting substrate. These monosilicon substrates 55, 52 are then laminated together in a laminating step P54 (FIG. 15B).

Figure 15C:
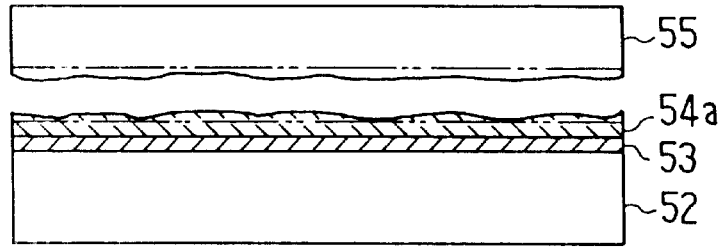
Figure 15D:
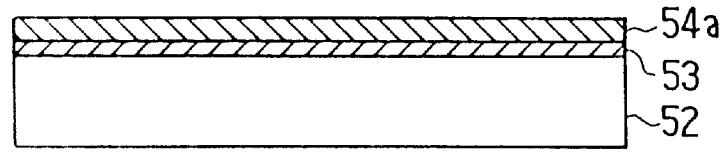

By going through a detaching step P55 a substrate of a structure wherein a monosilicon film 54a is formed on an oxide film 53 on a monosilicon substrate 52 can then be obtained (FIG. 15C). After that, the detachment face is polished in a polishing step R51 to flatten the surface of the monosilicon film 54a (FIG. 15D).

Figure 15E:
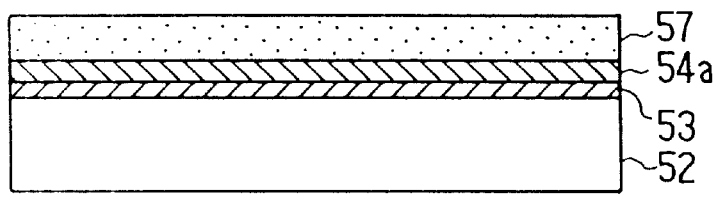
Figure 15F:
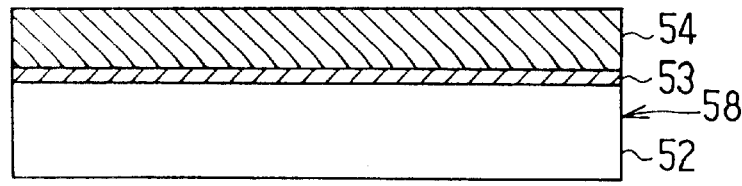
Figure 16A:
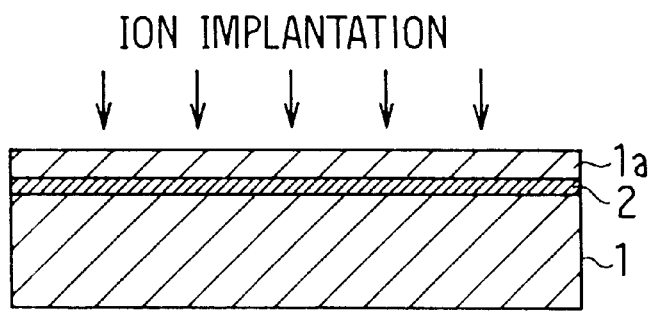
FIGS. 16A through 16D are schematic sectional views illustrating states of a semiconductor substrate in each step of a conventional manufacturing process.
Figure 16B:
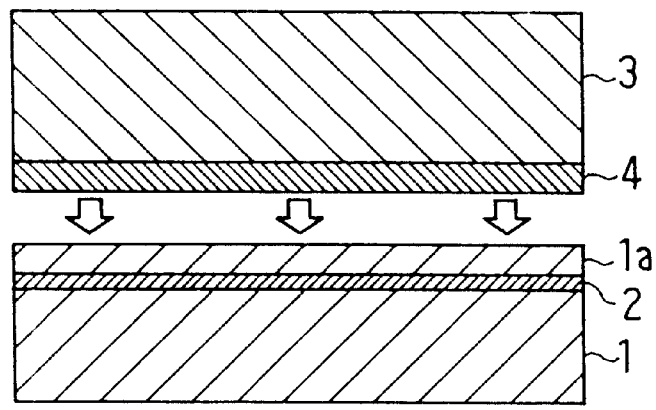
Figure 16C:
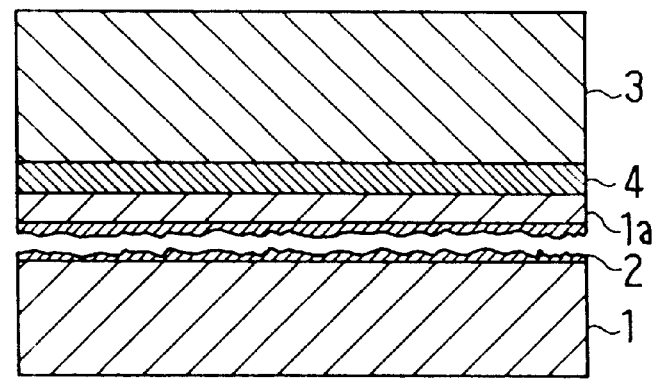
Figure 16D:
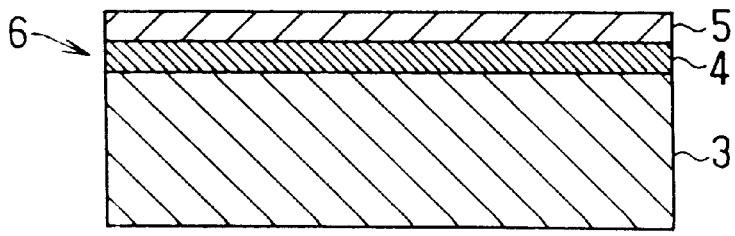

Next, in an amorphous silicon film forming step R52, which is a noncrystalline film forming step, an amorphous silicon film 57 is formed to a predetermined film thickness as a semiconductor noncrystalline film on the surface of the monosilicon film 54a (FIG. 15E). In this case, the formation of the amorphous silicon film 57 is carried out using plasma CVD or the like in the same way as that described above. After that, in a solid phase growth step R53, in the same way as that described above, the amorphous silicon film 57 is made to undergo solid phase growth with the monosilicon film 54a as a nucleus and thereby recrystallized to monocrystalline silicon to obtain a monosilicon film 54 as a semiconductor layer (FIG. 15F). After that, as necessary the surface of the monosilicon film 54 is polished and thereby finished to a smooth state and a SOI substrate 58 is obtained.

With this seventh preferred embodiment, using a SOI substrate on which a thin monocrystalline silicon film has been formed in advance, by carrying out the steps from the amorphous silicon film forming step R52 onward it is possible to obtain a SOI substrate having a high film thickness (of over about 10 μm) by going through a simple manufacturing process.

In the fifth through seventh preferred embodiments described above, monocrystalline materials based on group four elements other than silicon can also be used as the material of the base substrate for forming the semiconductor layer. For example Ge (germanium), SiC (silicon carbide), SiGe (silicon germanium), or diamond or the like can be used for the base substrate.

Also, the supporting substrate does not have to be a monocrystalline silicon substrate and may alternatively be another semiconductor substrate or a ceramic substrate. In the case of a ceramic substrate, because the supporting substrate itself is insulating, it is not necessary to form an insulating film such as an oxide film separately as is done in these preferred embodiments.

What is claimed is:

1. A method for manufacturing a semiconductor substrate comprising a semiconductor layer suitable for device formation and a supporting substrate on which the semiconductor layer is supported and which is insulated from the semiconductor layer, said method comprising:

implanting ions into a monocrystalline base substrate at a depth from a surface of the monocrystalline base substrate so that a portion of the monocrystalline base substrate having the ions implanted therein forms a defective layer and another portion of the monocrystalline base substrate between the surface of the monocrystalline base substrate and the defective layer defines a monocrystalline thin film layer, the defective layer partitioning the monocrystalline thin film layer from a remaining portion of the monocrystalline base substrate positioned on an opposite side of the defective layer from the monocrystalline thin film layer;

forming a monocrystalline semiconductor film having a thickness on the monocrystalline thin film layer at the surface of the monocrystalline base substrate;

laminating a supporting substrate to the surface of the monocrystalline base substrate at monocrystalline semiconductor film so that the monocrystalline semiconductor film is interposed between the supporting substrate and the remaining portion of the monocrystalline base substrate; and detaching the remaining portion of the monocrystalline base substrate from the supporting substrate at the defective layer.

2. The method of claim 1, wherein said implanting of ions into the monocrystalline base substrate is carried out with an oxide film formed on the surface of the monocrystalline base substrate, and wherein said method further comprises thereafter removing the oxide film.

3. The method of claim 1, wherein said forming of the monocrystalline semiconductor film is carried out at a sufficiently low temperature that there is no desorption of the ions implanted in the monocrystalline base substrate.

4. The method of claim 1, wherein said forming of the monocrystalline semiconductor film is carried out at a sufficiently low temperature that diffusion of impurities from the monocrystalline thin film layer into the monocrystalline semiconductor film is suppressed.

5. The method of claim 1, wherein said forming of the monocrystalline semiconductor film comprises growing the monocrystalline semiconductor film epitaxially so that crystals of the monocrystalline semiconductor film are aligned with a crystal axis of the monocrystalline thin film layer.

6. The method of claim 5, wherein said epitaxially growing of the monocrystalline semiconductor film is performed with a molecular beam epitaxy apparatus.

7. The method of claim 1, wherein the supporting substrate has an oxide film which, subsequent to said laminating, is interposed between the supporting substrate and the monocrystalline base substrate, and further wherein said detaching of the remaining portion of the monocrystalline base substrate from the supporting substrate at the defective layer exposes a surface of the monocrystalline thin film layer as a surface of the semiconductor layer.

8. A method for manufacturing a semiconductor substrate comprising a semiconductor layer suitable for device formation and a supporting substrate on which the semiconductor layer is supported and which is insulated from the semiconductor layer, said method comprising:

implanting ions into a monocrystalline base substrate at a depth from a surface of the monocrystalline base substrate so that a portion of the monocrystalline base substrate having the ions implanted therein forms a defective layer and another portion of the monocrystalline base substrate between the surface of the monocrystalline base substrate and the defective layer defines a monocrystalline thin film layer, the defective layer partitioning the monocrystalline thin film layer from a remaining portion of the monocrystalline base substrate positioned on an opposite side of the defective layer from the monocrystalline thin film layer;

laminating a supporting substrate to the monocrystalline base substrate at the monocrystalline thin film layer so that the monocrystalline thin film layer is interposed between the supporting substrate and the remaining portion of the monocrystalline base substrate;

detaching the remaining portion of the monocrystalline base substrate from the supporting substrate at the defective layer so that the monocrystalline thin film layer remains on the supporting substrate; and forming a monocrystalline semiconductor film having a thickness on the monocrystalline thin film layer remaining on the supporting substrate.

9. The method of claim 8, wherein said implanting of ions into the monocrystalline base substrate is carried out with an oxide film formed on the surface of the monocrystalline base substrate, and wherein said method further comprises thereafter removing the oxide film.

10. The method of claim 8, wherein said forming of the monocrystalline semiconductor film is carried out at a sufficiently low temperature that diffusion of impurities from the monocrystalline thin film layer into the monocrystalline semiconductor film is suppressed.

11. The method of claim 8, wherein said forming of the monocrystalline semiconductor film comprises growing the monocrystalline semiconductor film epitaxially so that crystals of the monocrystalline semiconductor film are aligned with a crystal axis of the monocrystalline thin film layer.

12. The method of claim 11, wherein said epitaxially growing of the monocrystalline semiconductor film is performed with a molecular beam epitaxy apparatus.

13. The method of claim 8, wherein the supporting substrate comprises an insulating film, and further wherein said laminating comprises laminating the monocrystalline semiconductor film to the insulating film of the supporting substrate.

14. The method of claim 8, wherein the supporting substrate has an oxide film which, subsequent to said laminating, is interposed between the supporting substrate and the monocrystalline base substrate, and further wherein a surface of the monocrystalline semiconductor film on the supporting substrate serves as a surface of the semiconductor layer.

15. A method for manufacturing a semiconductor substrate comprising a semiconductor layer suitable for device formation and a supporting substrate on which the semiconductor layer is supported and which is insulated from the semiconductor layer, said method comprising:

implanting ions into a base substrate at a depth from a surface of the base substrate so that a portion of the base substrate having the ions implanted therein forms an ion-implanted layer and another portion of the base substrate between the surface of the base substrate and the ion-implanted layer defines a thin film semiconductor layer, the thin film semiconductor layer having a facing surface which faces the ion-implanted layer, the ion-implanted layer being interposed between the thin film semiconductor layer and a remaining portion of the base substrate positioned on an opposite side of the ion-implanted layer from the thin film semiconductor layer;

forming a monocrystalline semiconductor film on the surface of the base substrate at a temperature sufficiently low to prevent the ions implanted into the base substrate during said implanting of ions from being desorbed from the base substrate into the monocrystalline semiconductor film;

laminating the base substrate to a supporting substrate to interpose the monocrystalline semiconductor film between the base substrate and the supporting substrate;

detaching the remaining portion of the base substrate from the supporting substrate at a defective layer part defined by the ion-implanted layer so that the monocrystalline semiconductor film and the thin film semiconductor layer remain on the supporting substrate, said detaching comprising heat treating the base substrate and the supporting substrate; and polishing the facing surface of the thin film semiconductor layer.

16. The method of claim 15, wherein said polishing of the facing surface further comprises removing a part of the thin film semiconductor layer damaged by the ions.

17. The method of claim 15, wherein said polishing of the facing surface further comprises polishing through the thin film semiconductor layer until the monocrystalline semiconductor film is exposed.

18. The method of claim 15, wherein said implanting of ions into the base substrate is carried out with an oxide film formed on the surface of the base substrate, and wherein said method further comprises thereafter removing the oxide film.

19. The method of claim 15, wherein said forming of the monocrystalline semiconductor film comprises growing the monocrystalline semiconductor film epitaxially.

20. The method of claim 19, wherein said epitaxially growing of the monocrystalline semiconductor film is performed with a molecular beam epitaxy apparatus.

21. The method of claim 19, wherein said epitaxially growing of the monocrystalline semiconductor film is performed with a chemical vapor deposition apparatus.

22. The method of claim 15, wherein the supporting substrate comprises an oxide film formed thereon.

23. The method of claim 15, further comprising polishing a face of the remaining portion of the base substrate from which the thin film semiconductor layer has been detached and recycling the remaining portion of the base substrate.

24. The method of claim 15, wherein the supporting substrate has an oxide film which, subsequent to said laminating, is interposed between the supporting substrate and the base substrate, and further wherein said detaching of the remaining portion of the base substrate from the supporting substrate at the defective layer part and said polishing of the facing surface of the thin film semiconductor layer exposes a surface of the monocrystalline semiconductor film as a surface of the semiconductor layer.

25. A method for manufacturing a semiconductor substrate comprising a semiconductor layer suitable for device formation and a supporting substrate on which the semiconductor layer is supported and which is insulated from the semiconductor layer, said method comprising:

forming a hydrogen rich layer on a monocrystalline semiconductor substrate;

forming a noncrystalline growth layer on the hydrogen rich layer so that the hydrogen rich layer is interposed between the noncrystalline growth layer and the monocrystalline semiconductor substrate, the noncrystalline growth layer and the monocrystalline semiconductor substrate having a same element;

laminating a supporting substrate to the monocrystalline semiconductor substrate at a surface of the noncrystalline growth layer;

heat treating the monocrystalline semiconductor substrate laminated to the supporting substrate at a first treatment temperature to monocrystallize the noncrystalline growth layer and form a thin film semiconductor layer; and heat treating the monocrystalline semiconductor substrate laminated to the supporting substrate at a second treatment temperature and detaching the thin film semiconductor layer from the monocrystalline semiconductor substrate at the hydrogen rich layer.

26. The method of claim 25, further comprising, prior to said forming of the noncrystalline growth layer, forming a segregation layer on the hydrogen rich layer.

27. The method of claim 26, wherein the segregation layer is an amorphous silicon carbide film.

28. The method of claim 27, wherein the segregation layer is a silicon oxide film consisting of one atom layer.

29. The method of claim 25, further comprising, after said detaching of the thin film semiconductor layer from the monocrystalline semiconductor substrate, heat treating the supporting substrate having the thin film semiconductor layer thereon at a third treatment temperature to enhance crystallinity of the thin film semiconductor layer.

30. The method of claim 25, wherein the hydrogen rich layer is a hydrogenated amorphous silicon film.

31. The method of claim 30, wherein said forming of the hydrogen rich layer comprises forming the hydrogenated amorphous silicon film by plasma CVD.

32. The method of claim 25, wherein the noncrystalline growth layer is an amorphous silicon film.

33. The method of claim 32, wherein said forming of the noncrystalline growth layer comprises forming the amorphous silicon film by plasma CVD.

34. A method for manufacturing a semiconductor substrate comprising a semiconductor layer suitable for device formation and a supporting substrate on which the semiconductor layer is supported and which is insulated from the semiconductor layer, said method comprising:

implanting ions into a base substrate at a depth from a surface of the base substrate so that a portion of the base substrate having the ions implanted therein forms an ion-implanted layer and another portion of the base substrate between the surface of the base substrate and the ion-implanted layer defines a thin film semiconductor layer, the ion-implanted layer partitioning the thin film semiconductor layer from a remaining portion of the base substrate positioned on an opposite side of the ion-implanted layer from the thin film semiconductor layer, the thin film semiconductor layer having a facing surface which faces the ion-implanted layer;

forming a semiconductor noncrystalline film on the surface of the base substrate at the thin film semiconductor layer;

laminating the base substrate to a supporting substrate to interpose the semiconductor noncrystalline film between the thin film semiconductor layer on the base substrate and the supporting substrate; and heating treating the base substrate laminated to the supporting substrate and detaching the remaining portion of the base substrate from the supporting substrate at the ion-implanting layer so that the thin film semiconductor layer and the noncrystalline film remain on the supporting substrate.

35. The method of claim 34, further comprising heat treating the semiconductor noncrystalline film to crystallize the semiconductor noncrystalline film by using the thin film semiconductor layer as a nucleus for crystallization, said heat treating of the semiconductor noncrystalline film occurring simultaneous with or subsequent to said heat treating of the base substrate and the supporting substrate.

36. The method of claim 35, wherein the supporting substrate has an oxide film which, subsequent to said laminating, is interposed between the supporting substrate and the base substrate, and further wherein the semiconductor noncrystalline film is crystallized to form a surface of the semiconductor layer.

37. The method of claim 34, said forming of the semiconductor noncrystalline film comprises forming the semiconductor noncrystalline film by plasma CVD.

38. The method of claim 34, further comprising polishing the facing surface of the thin film semiconductor layer.

39. The method of claim 34, wherein the ion-implanted layer has a thickness sufficient for the ion-implanted layer to serve as a nucleus for inducing solid phase growth of the semiconductor noncrystalline film.

40. The method of claim 34, wherein the base substrate is a monocrystalline silicon substrate, and further wherein the semiconductor noncrystalline film is an amorphous silicon film.

41. A method for manufacturing a semiconductor substrate comprising a semiconductor layer suitable for device formation and a supporting substrate on which the semiconductor layer is supported and which is insulated from the semiconductor layer, said method comprising:

implanting ions into a base substrate at a depth from a surface of the base substrate so that a portion of the base substrate having the ions implanted therein forms an ion-implanted layer and another portion of the base substrate between the surface of the base substrate and the ion-implanted layer defines a thin film semiconductor layer, the ion-implanted layer partitioning the thin film semiconductor layer from a remaining portion of the base substrate positioned on an opposite side of the ion-implanted layer from the thin film semiconductor layer, the thin film semiconductor layer having a facing surface which faces the ion-implanted layer;

forming a semiconductor noncrystalline film on a supporting substrate in such a manner that the semiconductor noncrystalline film is insulated;

laminating the semiconductor noncrystalline film with the supporting substrate to the thin film semiconductor layer of the base substrate; and heating treating the base substrate and the supporting substrate and detaching the remaining portion of the base substrate from the supporting substrate at the ion-implanting layer so that the thin film semiconductor layer and the noncrystalline film remain on the supporting substrate.

42. The method of claim 41, further comprising heat treating the semiconductor noncrystalline film to crystallize the semiconductor noncrystalline film by using the thin film semiconductor layer as a nucleus for crystallization, said heat treating of the semiconductor noncrystalline film occur simultaneous with or subsequent to said heat treating of the base substrate and the supporting substrate.

43. The method of claim 41, said forming of the semiconductor noncrystalline film comprises forming the semiconductor noncrystalline film by plasma CVD.

44. The method of claim 41, further comprising polishing the facing surface of the thin film semiconductor layer.

45. The method of claim 41, wherein the ion-implanted layer has a thickness sufficient for the ion-implanted layer to serve as a nucleus for inducing solid phase growth of the semiconductor noncrystalline film.

46. The method of claim 41, wherein the base substrate is a monocrystalline silicon substrate, and further wherein the semiconductor noncrystalline film is an amorphous silicon film.

47. A method for manufacturing a semiconductor substrate comprising a semiconductor layer suitable for device formation and a supporting substrate on which the semiconductor layer is supported and which is insulated from the semiconductor layer, said method comprising:

implanting ions into a base substrate at a depth from a surface of the base substrate so that a portion of the base substrate having the ions implanted therein forms an ion-implanted layer and another portion of the base substrate between the surface of the base substrate and the ion-implanted layer defines a thin film semiconductor layer, the ion-implanted layer partitioning the thin film semiconductor layer from a remaining portion of the base substrate positioned on an opposite side of the ion-implanted layer from the thin film semiconductor layer, the thin film semiconductor layer having a facing surface which faces the ion-implanted layer;

laminating the surface of the base substrate at which the ion-implanted layer is formed to a supporting substrate;

heating treating the base substrate and the supporting substrate and detaching the remaining portion of the base substrate from the supporting substrate at the ion-implanting layer so that the thin film semiconductor layer remains on the supporting substrate;

forming a semiconductor noncrystalline film on the thin film semiconductor layer disposed on the supporting substrate; and crystallizing the semiconductor noncrystalline film by using the thin film semiconductor layer as a nucleus to cause solid phase growth.

48. The method of claim 47, said forming of the semiconductor noncrystalline film comprises forming the semiconductor noncrystalline film by plasma CVD.

49. The method of claim 47, further comprising polishing the facing surface of the thin film semiconductor layer.

50. The method of claim 47, wherein the ion-implanted layer has a thickness sufficient for the ion-implanted layer to serve as a nucleus for inducing solid phase growth of the semiconductor noncrystalline film.

51. The method of claim 47, wherein the base substrate is a monocrystalline silicon substrate, and further wherein the semiconductor noncrystalline film is an amorphous silicon film.

52. The method of claim 47, wherein the supporting substrate has an oxide film which, subsequent to said laminating, is interposed between the supporting substrate and the base substrate, and further wherein the semiconductor noncrystalline film is crystallized to form a surface of the semiconductor layer.

53. A method for manufacturing a semiconductor substrate, comprising:

preparing a base substrate having a defective layer at a depth from a surface of the base substrate;

forming a noncrystalline semiconductor layer on at least one member selected from the group consisting of the surface of the base substrate and a surface of the supporting substrate;

bonding the base substrate and the supporting substrate together with the noncrystalline semiconductor layer interposed between the base and supporting substrates;

detaching the supporting substrate from the base substrate at the defective layer and retaining the noncrystalline semiconductor layer on the supporting substrate; and crystallizing the noncrystalline semiconductor layer subsequent to said bonding of the base substrate and the supporting substrate.

54. The method of claim 53, wherein the semiconductor layer is formed as a monocrystalline semiconductor layer.

55. The method of claim 53, wherein said crystallizing of the noncrystalline semiconductor layer is performed after said detaching of the supporting substrate from the base substrate.

* * * * *